(12) United States Patent
Hsu et al.

(10) Patent No.: US 9,370,105 B2
(45) Date of Patent: Jun. 14, 2016

(54) PACKAGE APPARATUS WITH MULTIPLE PILLAR LAYERS

(71) Applicant: PHOENIX PIONEER TECHNOLOGY CO., LTD., Hsinchu County (TW)

(72) Inventors: Che-Wei Hsu, Hsinchu County (TW); Shih-Ping Hsu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 14/502,065

(22) Filed: Sep. 30, 2014

(65) Prior Publication Data

US 2015/0366064 A1 Dec. 17, 2015

(30) Foreign Application Priority Data

Jun. 16, 2014 (TW) .............................. 103120747 A

(51) Int. Cl.
*H05K 1/18* (2006.01)
*H05K 1/11* (2006.01)
(Continued)

(52) U.S. Cl.
CPC ............ *H05K 1/181* (2013.01); *H01L 21/4857* (2013.01); *H01L 23/49822* (2013.01); *H01L 25/0657* (2013.01); *H05K 1/0298* (2013.01); *H05K 1/0326* (2013.01); *H05K 1/0333* (2013.01); *H05K 1/115* (2013.01); *H05K 3/10* (2013.01); *H05K 3/4007* (2013.01); *H01L 23/295* (2013.01); *H01L 23/49861* (2013.01); *H01L 23/5383* (2013.01); *H01L 25/16* (2013.01); *H01L 2224/16145* (2013.01); *H01L 2224/16225* (2013.01); *H01L 2224/81191* (2013.01); *H01L 2224/81192* (2013.01); *H01L 2225/06513* (2013.01); *H01L 2225/06517* (2013.01); *H01L 2225/06555* (2013.01); *H01L 2225/06572* (2013.01); *H01L 2924/15311* (2013.01); *H01L 2924/19106* (2013.01); *H05K 2201/0367* (2013.01); *Y10T 29/49149* (2015.01)

(58) Field of Classification Search
CPC ... H01L 23/49861; H01L 24/81; H01L 21/56; H05K 1/0298; H05K 1/0274; H05K 1/028; H05K 1/115; H05K 1/182; H05K 3/284; H05K 3/10; H05K 3/32; H05K 2201/09563
USPC ............................ 257/676; 438/123; 361/761
See application file for complete search history.

(56) References Cited

U.S. PATENT DOCUMENTS

2003/0017647 A1* 1/2003 Kwon .................. H01L 21/568
438/109

*Primary Examiner* — Evan Pert
*Assistant Examiner* — Changhyun Yi
(74) *Attorney, Agent, or Firm* — WPAT, PC; Justin King

(57) ABSTRACT

A package apparatus comprises a first conductive wiring layer, a first conductive pillar layer, a dielectric material layer, a second conductive wiring layer, a second conductive pillar layer, and a first molding compound layer. The first conductive wiring layer has a first surface and a second surface opposite to the first surface. The first conductive pillar layer is disposed on the first surface of the first conductive wiring layer, wherein the first conductive wiring layer and the first conductive pillar layer are disposed inside the dielectric material layer. The second conductive wiring layer is disposed on the first conductive pillar layer and the dielectric material layer. The second conductive pillar layer is disposed on the second conductive wiring layer, wherein the second conductive wiring layer and the second conductive pillar layer are disposed inside the first molding compound layer.

40 Claims, 32 Drawing Sheets

(51) Int. Cl.
*H01L 21/48* (2006.01)
*H01L 23/498* (2006.01)
*H05K 3/10* (2006.01)
*H05K 3/40* (2006.01)
*H05K 1/03* (2006.01)
*H05K 1/02* (2006.01)
*H01L 25/065* (2006.01)
*H01L 23/538* (2006.01)
*H01L 23/29* (2006.01)
*H01L 25/16* (2006.01)

PACKAGE APPARATUS WITH MULTIPLE PILLAR LAYERS

FIELD OF THE INVENTION

The present invention relates to a package apparatus and manufacturing method thereof, and more particularly, to a semiconductor package apparatus and method for manufacturing the same

BACKGROUND OF THE INVENTION

With the design trend in electronic devices is toward lighter, smaller, thinner but more functional devices with performance requirements continuing to increase, device manufacturers increasingly need specialty integrated circuit (IC) solutions for allowing billions of miniature electronic components to be densely packed in a small area. Thus, device manufacturers come up with innovative packaging techniques for embedding electronic components in a substrate while allowing shorter traces between the electronic components and the substrate. In addition, the layout area is increased by the use of built-up technique as the technology advances for achieving lighter, smaller, thinner and more functional high-performance devices.

Generally, most high-end chips are packaged by flip chip (FC) process, especially by a chip scale package (CSP) process, as those high-end chips are primarily being applied in smart phones, tablet computers, network communication devices, and notebook computers, whichever is generally operating under high-frequency and high-speed condition and required to be packed in a thin, small and light-weighted semiconductor package. As for the carrier for packaging, the popular design nowadays includes: small pitches between lines, high density, thin-type design, low manufacture cost, and high electrical characteristic.

Generally, by the application of coreless substrate technology, the limitation of those conventional substrates for having to have a rigid bismaleimide trizaone (BT) core layer or a FR-5 core layer can be relieved and thus not only the material cost in the substrate fabrication can be reduced as the amount of layers to be formed in a substrate is decreased, but also the I/O density in a substrate is increased. It is noted that the conventional coreless substrate includes primarily the molded interconnection substrate (MIS) and the embedded pattern plating (EPP) substrate.

Please refer to FIG. 1, which is schematic diagram showing a conventional molding compound coreless substrate structure with MIS. As shown in FIG. 1, the molding compound substrate structure 10 comprises: a first conductive pillar layer 100, a metal layer 110, a second conductive pillar layer 120, a molding compound layer 130, a dielectric material layer 140, a third conductive pillar layer 150 and a solder resist layer 160. Wherein, the first conductive layer 100 is formed with a top surface and a bottom surface that are arranged opposite to each other, while allowing the metal layer 110 to be disposed on the bottom surface and the second conductive pillar layer 120 to be disposed on the top surface; the molding compound layer 130 is disposed within a specific portion of the first conductive pillar layer 100 and the second conductive pillar layer 120; the dielectric material layer 140 is disposed on the molding compound layer 130; the third conductive pillar layer 150 is disposed on the second conductive pillar layer 230, the molding compound layer 130 and the dielectric material layer 140; and the solder resist layer 160 is disposed on the dielectric material layer 140 and the second conductive pillar layer 150.

Nevertheless, the aforesaid conventional molding compound substrate structure still has shortcomings, as following: (1) It is required to have a process for forming an additional dielectric material layer 140 for solving the insufficient binding force issue between the molding compound layer 130 and the other conductive pillar layers so as to fabricate fine-line products. Nevertheless, the additional process for forming the dielectric material layer 140 not only is going to increase the steps to be performed in the fabrication process, but also is going to increase the production cost. (2) As the solder resist layer 160 is designed to be disposed between the dielectric material layer 140 and the third conductive pillar layer 150, in a ball grid array (BGA) packaging process, the reliability of any posterior process can be adversely affected by the resolution of solder mask opens in the BGA and the film thickness uniformity of the solder resist layer 160 as well.

Please refer to FIG. 2, which is schematic diagram showing a conventional embedded pattern plating (EPP) coreless substrate structure. As shown in FIG. 1, the EPP substrate structure 20 comprises: a first conductive pillar layer 200, a second conductive pillar layer 210, a dielectric material layer 220, a third conductive pillar layer 230, a first solder resist layer 240, a second solder resist layer 250, a first electrode layer 260 and a second electrode layer 270. Wherein, the first conductive layer 200 is formed with a top surface and a bottom surface that are arranged opposite to each other, while allowing the second conductive pillar layer 210 to be disposed on the top surface, and the dielectric material layer 220 to be disposed within a specific portion of the first conductive pillar layer 200 and the second conductive pillar layer 210; the third conductive pillar layer 230 is disposed on the second conductive pillar layer 210 and the dielectric material layer 220; the first solder resist layer 240 is disposed on the first conductive pillar layer 200 and the dielectric material layer 220; the second solder resist layer 250 is disposed on the third conductive pillar layer 230 and the dielectric material layer 220; the first electrode layer 260 is disposed on the bottom surface of the first conductive pillar layer 200; and the second electrode layer 270 is disposed on the third conductive pillar layer 230.

Similarly, the aforesaid EPP substrate structure 20 still has the following shortcomings, that is, as the first solder resist layer 240 is designed to be disposed on the first conductive pillar layer 200 and the dielectric material layer 220, while the second solder resist layer 250 is disposed on the third conductive pillar layer 230 and the dielectric material layer 220, in a ball grid array (BGA) packaging process, the reliability of any posterior process can be adversely affected by the resolution of solder mask opens in the BGA and the film thickness uniformity of the two solder resist layers 240, 250 as well.

SUMMARY OF THE INVENTION

The primary object of the present invention is to provide a package apparatus and manufacturing method thereof, in which a first molding compound layer in a conventional molding compound substrate structure is replaced by a dielectric material layer that is formed by additive layout process, and thereby the production cost and the production complexity are decreased as the conventional insufficient binding force issue between the first molding compound layer and the other conductive layers that is generally seen in the fabrication of fine-line products and requires to be solved by an additional dielectric material layer is eliminated.

Moreover, the present invention also provides a package apparatus and manufacturing method thereof, in which a solder resist layer that is generally seen in those conventional molding compound substrate structures or EPP substrate structures is replaced by a molding compound layer and thus the process used for forming the solder resist layer can be avoided, so that the conventional problems resulting from the poor resolution of solder mask opens in the BGA and the poor film thickness uniformity of the solder resist layer are avoided and thus the reliability of any posterior process is improved.

In an embodiment, the present invention provides a package apparatus comprises: a first conductive wiring layer, a first conductive pillar layer, a dielectric material layer, a second conductive wiring layer, a second conductive pillar layer, and a first molding compound layer. The first conductive wiring layer has a first surface and a second surface opposite to the first surface. The first conductive pillar layer is disposed on the first surface of the first conductive wiring layer, and the first conductive wiring layer and the first conductive pillar layer are disposed inside the dielectric material layer. The second conductive wiring layer is disposed on the first conductive pillar layer and the dielectric material layer. The second conductive pillar layer is disposed on the second conductive wiring layer, and the second conductive wiring layer and the second conductive pillar layer are disposed inside the first molding compound layer.

In another embodiment, the first surface of the first conductive wiring layer in a package apparatus of the present invention can be disposed higher than, lower than or coplanar with the dielectric material layer while allowing the second conductive pillar layer to be formed higher than, lower than or coplanar with the first molding compound layer.

In another embodiment, the dielectric material layer in a package apparatus of the present invention is formed covering all the surfaces of the first conductive wiring layer or covering a specific portion of the surfaces of the first conductive wiring layer, while the first molding compound layer is formed covering all the surfaces of the second conductive pillar layer or covering a specific portion of the surfaces of the second conductive pillar layer.

In another embodiment, the present invention provides a method for manufacturing a package apparatus, which comprises the steps of: providing a metal carrier having a first side and a second side that are arranged opposite to each other; forming a first conductive wiring layer on the first side of the metal carrier; forming a first conductive pillar layer on the first conductive wiring layer; forming a dielectric material layer on the first side of the metal carrier for enabling the same to cover the first conductive wiring layer and the first conductive pillar layer while allowing the first conductive wiring layer and the first conductive pillar layer to be disposed inside the dielectric material layer; exposing the first conductive pillar layer; forming a second conductive wiring layer on the first conductive pillar layer and the dielectric material layer; forming a second conductive pillar layer on the second conductive wiring layer; forming a first molding compound layer on the dielectric material layer for enabling the same to cover the second conductive wiring layer and the second conductive pillar layer while allowing the second conductive wiring layer and the second conductive pillar layer to be disposed inside the first molding compound layer; exposing the second conductive pillar layer; and removing the metal carrier.

In another embodiment, the present invention provides a package apparatus comprises: a first conductive wiring layer, a first conductive pillar layer, a dielectric material layer, a second conductive wiring layer, and a first molding compound layer. The first conductive wiring layer has a first surface and a second surface opposite to the first surface, and the first conductive wiring layer is disposed inside the dielectric material layer. The first conductive pillar layer is disposed on the first conductive wiring layer and the dielectric material layer. The second conductive wiring layer is disposed on the first conductive pillar layer while allowing the first conductive pillar layer and the second conductive wiring layer to be disposed inside the first molding compound layer.

In another embodiment, the present invention provides a method for manufacturing a package apparatus, which comprises the steps of: providing a metal carrier having a first side and a second side that are arranged opposite to each other; forming a first conductive wiring layer on the first side of the metal carrier; forming a first conductive pillar layer on the first conductive wiring layer; forming a dielectric material layer on the first side of the metal carrier for enabling the same to cover the first conductive wiring layer while allowing the first conductive wiring layer to be disposed inside the dielectric material layer; exposing the first conductive wiring layer; forming a first conductive pillar layer on the first conductive wiring layer and the dielectric material layer; forming a second conductive wiring layer on the first conductive pillar layer; forming a first molding compound layer on the dielectric material layer for enabling the same to cover the first conductive pillar layer and the second conductive wiring layer while allowing the first conductive pillar layer and the second conductive wiring layer to be disposed inside the first molding compound layer; exposing the second conductive wiring layer; and removing the metal carrier.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
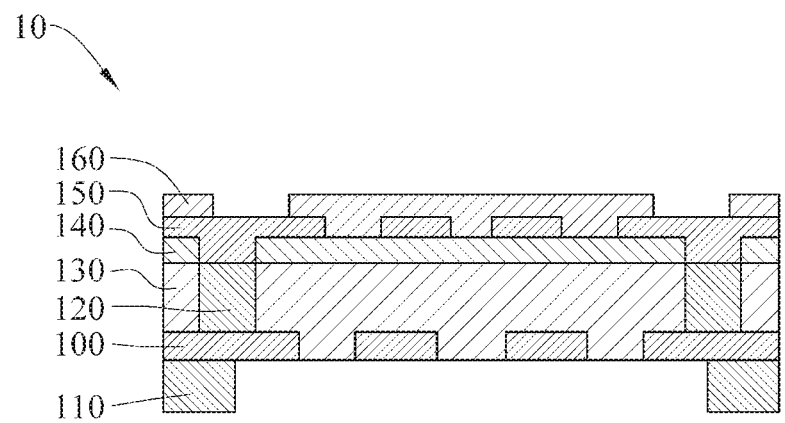
FIG. 1 is schematic diagram showing a conventional molding compound coreless substrate structure with MIS.
Figure 2:
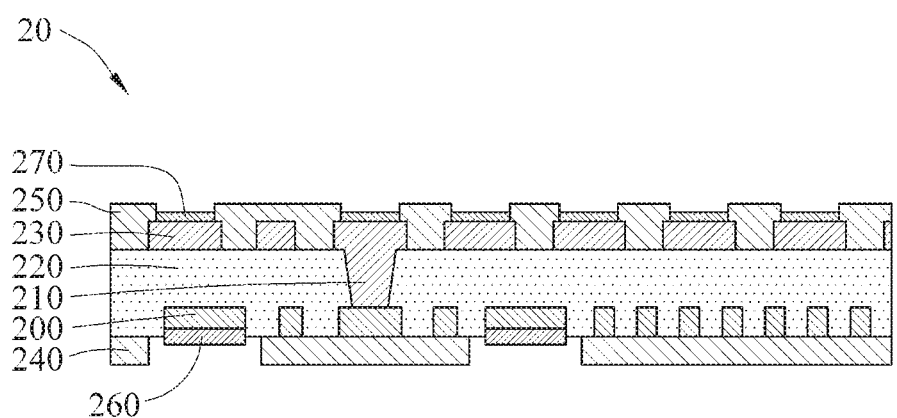
FIG. 2 is schematic diagram showing a conventional embedded pattern plating (EPP) coreless substrate structure.
Figure 3A:
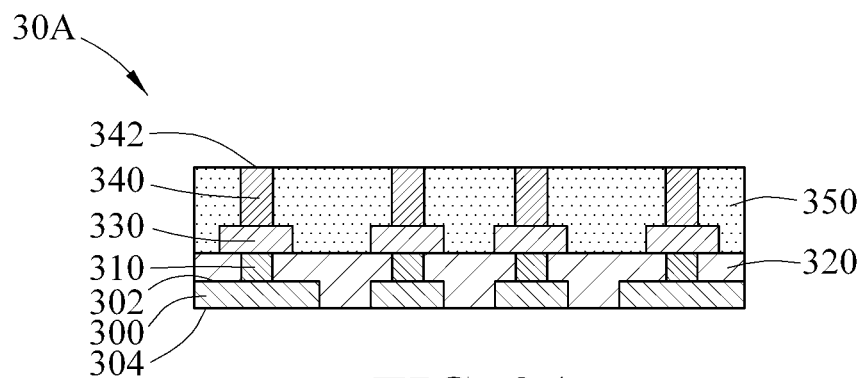
FIG. 3A is schematic diagram showing a package apparatus according to a first embodiment of the present invention.

Please refer to FIG. 3A, which is schematic diagram showing a package apparatus according to a first embodiment of the present invention. In FIG. 3A, a package apparatus 30A is disclosed, which comprises: a first conductive wiring layer 300, a first conductive pillar layer 310, a dielectric material layer 320, a second conductive wiring layer 330, a second conductive pillar layer 340 and a first molding compound layer 350. The first conductive wiring layer 300 is formed with a first surface 302 and a second surface 304 that are arranged opposite to each other, and in an embodiment, the first conductive wiring layer 300 can be a wiring layer with patterns which includes at least one wire or at least one chip seat. In addition, the first conductive pillar layer 310 is disposed on the first surface 302 of the first conductive wiring layer 300, while allowing the first conductive wiring layer 300 and the first conductive pillar layer 310 to be disposed inside the dielectric material layer 320. It is noted that the dielectric material layer 320 can be made of a thermosetting substance or a photo-sensitive substance, whichever is composed of a resin material, a silicon nitride material or a silicon oxide material, but is not limited thereby.

The second conductive wiring layer 330 is disposed on the first conductive pillar layer 310 and the dielectric material layer 320, and the second conductive wiring layer 340 is disposed on the second conductive wiring layer 330. Similarly, the second conductive pillar layer 340 can be a wiring layer with patterns which includes at least one wire or at least one chip seat, whereas in this embodiment, the second conductive pillar layer 340 is a ball grid array (BGA) electrode layer. In addition, the second conductive wiring layer 330 and the second conductive pillar layer 340 are disposed inside the first molding compound layer 350, whereas the first molding compound layer 350 is made of a molding compound material for chip packaging and is composed of a material selected from the group consisting of novolac-based resin, epoxy-based resin, silicon-based resign and other molding compounds, but is not limited thereby.

In the present invention, the second surface 304 of the first conductive wiring layer 300 can be disposed higher than, or lower than the dielectric material layer 320 while allowing the second conductive pillar layer 340 to be formed and disposed higher than, or lower than the first molding compound layer 350. In this embodiment, the second surface 304 of the first conductive wiring layer 300 is disposed coplanar with the dielectric material layer 320, and the first surface 342 of the second conductive pillar layer 340 is disposed coplanar with the first molding compound layer 350, however, they are not limited thereby.

It is noted that, in the present invention, a dielectric material layer that is formed by additive layout process is used for replacing a first molding compound layer in a conventional molding compound substrate structure, and thereby the production cost and the production complexity are decreased as the conventional insufficient binding force issue between the first molding compound layer and the other conductive layers that is generally seen in the fabrication of fine-line products and requires to be solved by an additional dielectric material layer is eliminated.

Moreover, in the present invention, the line width of the second conductive wiring layer 330 can be formed not larger than or larger than the pillar width of the second conductive pillar layer 340. In this embodiment, the line width of the second conductive wiring layer 330 is formed larger than the pillar width of the second conductive pillar layer 340, but is not limited thereby.

On the other hand, in a condition when the line width of the second conductive wiring layer 330 is formed small than the pillar width of the second conductive pillar layer 340, the precision of solder mask alignment in a solder mask design (SMD) for a posterior process will no longer be a problem, and thus there will be no need to design the line width of the second conductive wiring layer 330 that is to be formed larger than the pillar width of the second conductive pillar layer 340. Consequently, by the structure shown in this embodiment, the flexible of the package design is increased. In addition, in the present invention, the first molding compound layer is provided and used for replacing a solder resist layer that is generally seen in those conventional molding compound substrate structures or EPP substrate structures, and thus the process used for forming the solder resist layer can be avoided, so that the conventional problems resulting from the poor resolution of solder mask opens in the BGA and the poor film thickness uniformity of the solder resist layer are avoided and thus the reliability of any posterior process is improved.

Figure 3B:
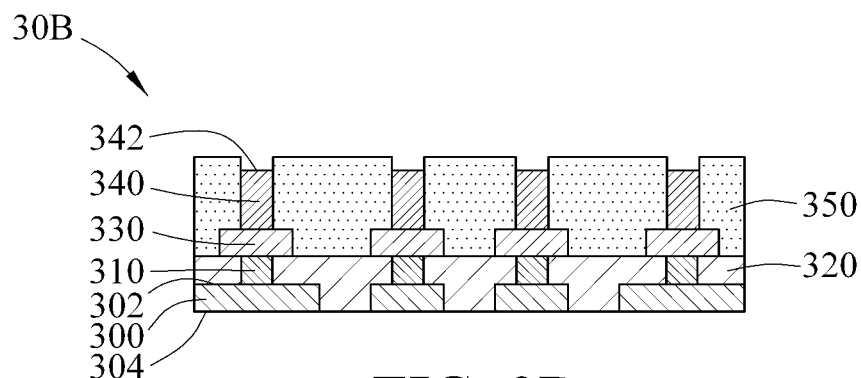
FIG. 3B is schematic diagram showing a package apparatus according to a second embodiment of the present invention.

Please refer to FIG. 3B, which is schematic diagram showing a package apparatus according to a second embodiment of the present invention. The package apparatus 30B of FIG. 3B is structured similar to the package apparatus 30A shown in FIG. 3A, whereas the second surface 304 of the first wiring layer 300 of the package apparatus 30B is disposed coplanar with the dielectric material layer 320, but is different in that: the first surface 342 of the second conductive pillar layer 340 is disposed lower than the first molding compound layer 350, but is not limited thereby.

Figure 3C:
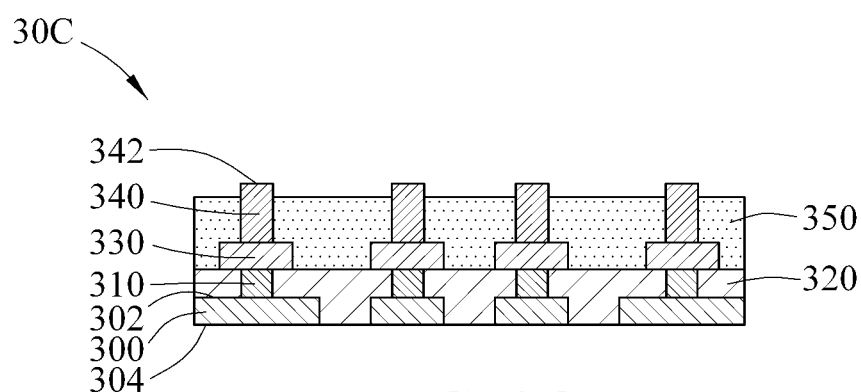
FIG. 3C is schematic diagram showing a package apparatus according to a third embodiment of the present invention.

Please refer to FIG. 3C, which is schematic diagram showing a package apparatus according to a third embodiment of the present invention. The package apparatus 30C of FIG. 3C is structured similar to the package apparatus 30A shown in FIG. 3A, whereas the second surface 304 of the first wiring layer 300 of the package apparatus 30C is disposed coplanar with the dielectric material layer 320, but is different in that: the first surface 342 of the second conductive pillar layer 340 is disposed higher than the first molding compound layer 350, but is not limited thereby.

Figure 3D:
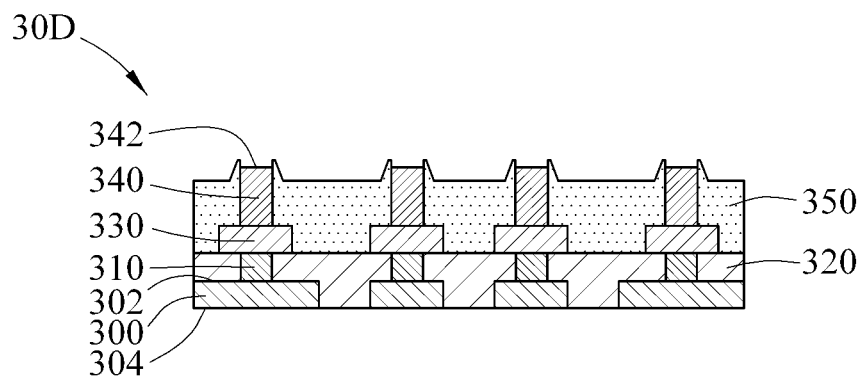
FIG. 3D is schematic diagram showing a package apparatus according to a fourth embodiment of the present invention.

Please refer to FIG. 3D, which is schematic diagram showing a package apparatus according to a fourth embodiment of the present invention. The package apparatus 30D is structured similar to the package apparatus 30A shown in FIG. 3A, whereas the second surface 304 of the first wiring layer 300 of the package apparatus 30D is disposed coplanar with the dielectric material layer 320, but is different in that: the first surface 342 of the second conductive pillar layer 340 is disposed lower than the first molding compound layer 350 while allowing the first molding compound layer 350 to be formed covering all the surfaces of the second conductive pillar layer 340, but is not limited thereby.

Figure 3E:
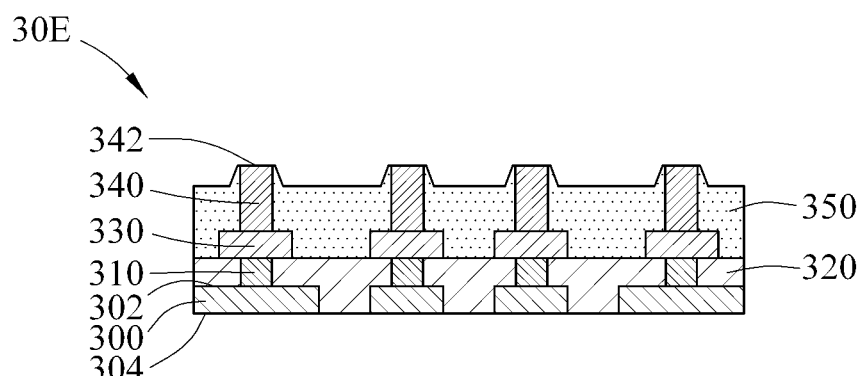
FIG. 3E is schematic diagram showing a package apparatus according to a fifth embodiment of the present invention.

Please refer to FIG. 3E, which is schematic diagram showing a package apparatus according to a fifth embodiment of the present invention. The package apparatus 30E is structured similar to the package apparatus 30D shown in FIG. 3D, whereas the second surface 304 of the first wiring layer 300 of the package apparatus 30E is disposed coplanar with the dielectric material layer 320, but is different in that: the first surface 342 of the second conductive pillar layer 340 is disposed coplanar with the first molding compound layer 350 while allowing the first molding compound layer 350 to be formed covering all the surfaces of the second conductive pillar layer 340, but is not limited thereby.

Figure 3F:
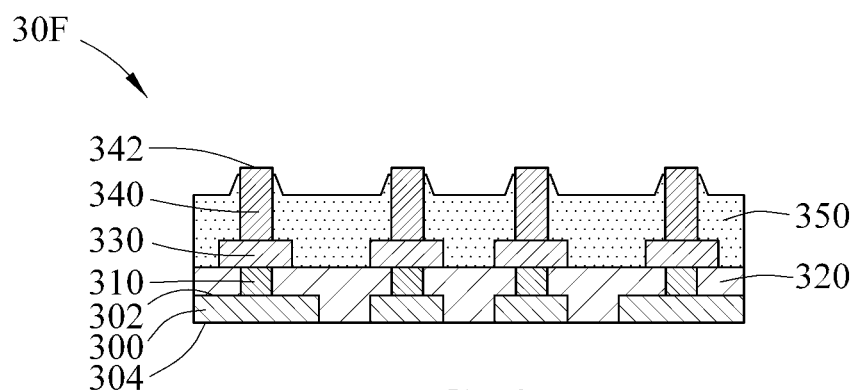
FIG. 3F is schematic diagram showing a package apparatus according to a sixth embodiment of the present invention.

Please refer to FIG. 3F, which is schematic diagram showing a package apparatus according to a sixth embodiment of the present invention. The package apparatus 30F is structured similar to the package apparatus 30D shown in FIG. 3D, whereas the second surface 304 of the first wiring layer 300 of the package apparatus 30D is disposed coplanar with the dielectric material layer 320, but is different in that: the first surface 342 of the second conductive pillar layer 340 is disposed higher than the first molding compound layer 350 while allowing the first molding compound layer 350 to be formed covering a specific portion of the surfaces of the second conductive pillar layer 340, but is not limited thereby.

Figure 3G:
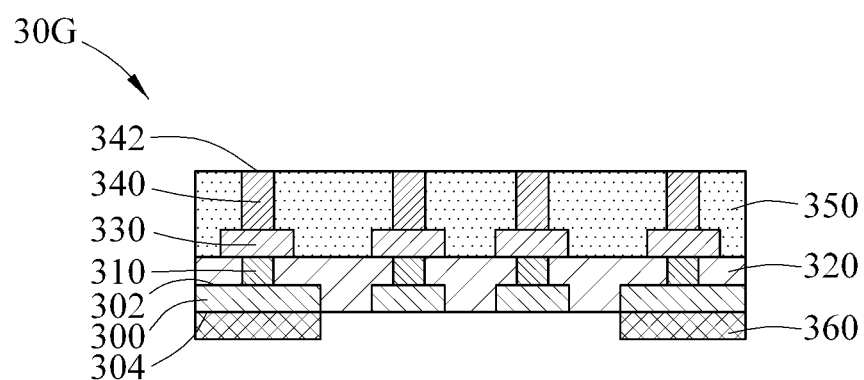
FIG. 3G is schematic diagram showing a package apparatus according to a seventh embodiment of the present invention.

Please refer to FIG. 3G, which is schematic diagram showing a package apparatus according to a seventh embodiment of the present invention. In this embodiment, the package apparatus 30G is basically formed as the package apparatus 30A shown in FIG. 3A, but with an additional solder resist layer 360 that is being formed and disposed on the second surface 304 of the first conductive wiring layer 300 and the dielectric material layer 320, while allowing a portion of the first conductive wiring layer 300 and a portion of the dielectric material layer 320 to be exposed for packaging, but it is noted limited thereby. It is noted that the structure shown in this embodiment employs a non-solder mask design (NSMD), by which only a portion of the first conductive wiring layer 300 and the consequent dielectric material layer 320 are exposed for packaging, the rest of the first conductive wiring layer 300 and the dielectric material layer 320 are covered and protected by the solder resist layer 360.

Figure 3H:
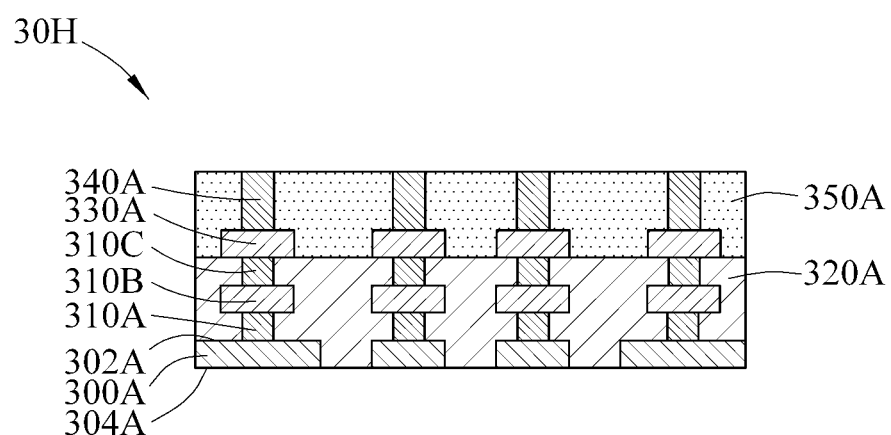
FIG. 3H is schematic diagram showing a package apparatus according to an eighth embodiment of the present invention.

Please refer to FIG. 3H, which is schematic diagram showing a package apparatus according to an eighth embodiment of the present invention. In FIG. 3H, a package apparatus 30H is disclosed, which comprises: a first conductive wiring layer 300A, a first conductive pillar layer 310A, a second conductive wiring layer 310B, a second conductive pillar layer 310C, a dielectric material layer 320A, a third conductive wiring layer 330A, a third conductive pillar layer 340A and a first molding compound layer 350A. The first conductive wiring layer 300A is formed with a first surface 302A and a second surface 304A that are arranged opposite to each other, and in an embodiment, the first conductive wiring layer 300A can be a wiring layer with patterns which includes at least one wire or at least one chip seat. In addition, the first conductive pillar layer 310A is disposed on the first surface 302A of the first conductive wiring layer 300A, the second conductive wiring layer 310B is disposed on the first conductive pillar layer 310A, and the second conductive pillar layer 310C is disposed on the second conductive wiring layer 310B, while allowing the first conductive wiring layer 300A, the first conductive pillar layer 310A, the second conductive wiring layer 310B and the second conductive pillar layer 310C to be disposed inside the dielectric material layer 320A. It is noted that the dielectric material layer 320A can be made of a thermosetting substance or a photo-sensitive substance, whichever is composed of a resin material, a silicon nitride material or a silicon oxide material, but is not limited thereby.

The third conductive wiring layer 330A is disposed on the second conductive pillar layer 310C and the third conductive pillar layer 340A is disposed on the third conductive wiring layer 330A. Similarly, the third conductive pillar layer 340A can be a wiring layer with patterns which includes at least one wire or at least one chip seat, whereas in this embodiment, the third conductive pillar layer 340A is a ball grid array (BGA) electrode layer. In addition, the third conductive wiring layer 330A and the third conductive pillar layer 340A are disposed inside the first molding compound layer 350A, whereas the first molding compound layer 350A is made of a molding compound material for chip packaging and is composed of a material selected from the group consisting of novolac-based resin, epoxy-based resin, silicon-based resign and other molding compounds, but is not limited thereby.

It is noted that the package apparatus 30H is formed basically the same as the package apparatus 30A shown in the first embodiment, but is different in that: the first conductive pillar layer 310 in the package apparatus 30A is replaced by the cooperation of the first conductive pillar layer 310A, the second conductive wiring layer 310B and the second conductive pillar layer 310C in the package apparatus 30H.

Figure 4A:
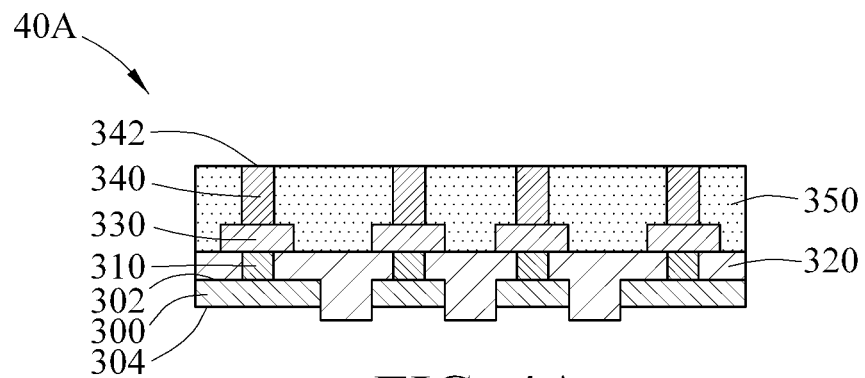
FIG. 4A is schematic diagram showing a package apparatus according to a ninth embodiment of the present invention.

Please refer to FIG. 4A, which is schematic diagram showing a package apparatus according to a ninth embodiment of the present invention. The package apparatus 40A of FIG. 4A is structured similar to the package apparatus 30A shown in FIG. 3A, but is different in that: the second surface 304 of the first wiring layer 300 of the package apparatus 40A is disposed lower than the dielectric material layer 320, but still the first surface 342 of the second conductive pillar layer 340 is disposed coplanar with the first molding compound layer 350, but is not limited thereby.

Figure 4B:
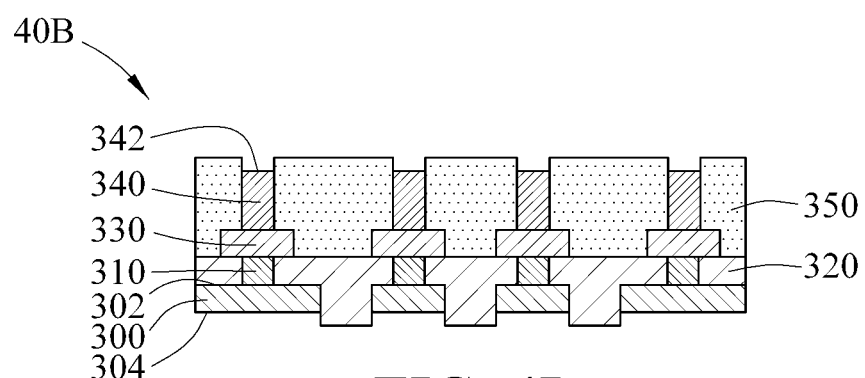
FIG. 4B is schematic diagram showing a package apparatus according to a tenth embodiment of the present invention.

Please refer to FIG. 4B, which is schematic diagram showing a package apparatus according to a tenth embodiment of the present invention. The package apparatus 40B of FIG. 4B is structured similar to the package apparatus 40A shown in FIG. 4A, whereas the second surface 304 of the first wiring layer 300 of the package apparatus 40B is disposed lower than the dielectric material layer 320, but is different in that: the first surface 342 of the second conductive pillar layer 340 is disposed lower than the first molding compound layer 350, but is not limited thereby.

Figure 4C:
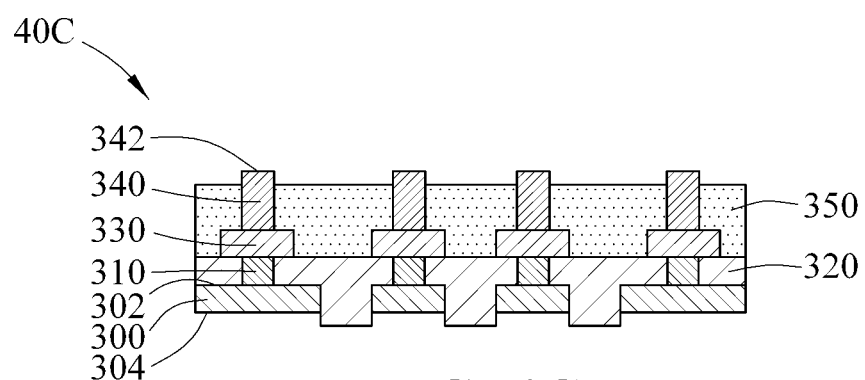
FIG. 4C is schematic diagram showing a package apparatus according to an eleventh embodiment of the present invention.

Please refer to FIG. 4C, which is schematic diagram showing a package apparatus according to an eleventh embodiment of the present invention. The package apparatus 40C of FIG. 4C is structured similar to the package apparatus 40A shown in FIG. 4A, whereas the second surface 304 of the first wiring layer 300 of the package apparatus 40C is disposed lower than the dielectric material layer 320, but is different in that: the first surface 342 of the second conductive pillar layer 340 is disposed higher than the first molding compound layer 350, but is not limited thereby.

Figure 4D:
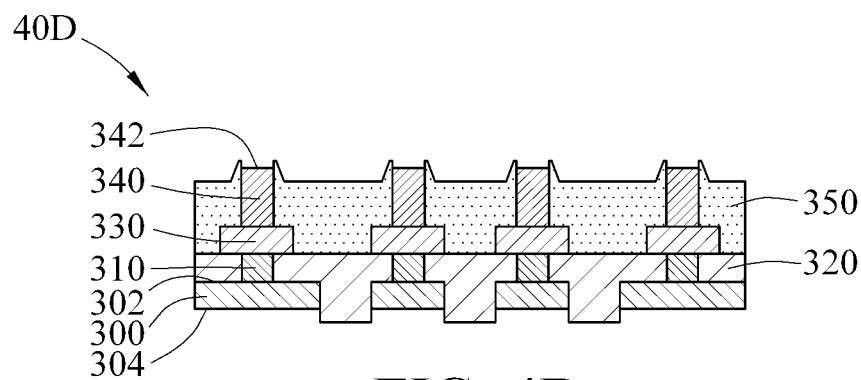
FIG. 4D is schematic diagram showing a package apparatus according to a twelfth embodiment of the present invention.

Please refer to FIG. 4D, which is schematic diagram showing a package apparatus according to a twelfth embodiment of the present invention. The package apparatus 40D is structured similar to the package apparatus 40A shown in FIG. 4A, whereas the second surface 304 of the first wiring layer 300 of the package apparatus 30E is disposed lower than the dielectric material layer 320, but is different in that: the first surface 342 of the second conductive pillar layer 340 is disposed lower than the first molding compound layer 350 while allowing the first molding compound layer 350 to be formed covering all the surfaces of the second conductive pillar layer 340, but is not limited thereby.

Figure 4E:
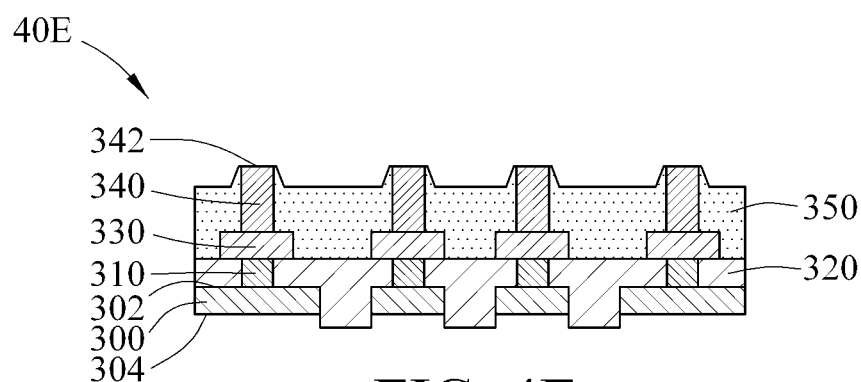
FIG. 4E is schematic diagram showing a package apparatus according to a thirteenth embodiment of the present invention.

Please refer to FIG. 4E, which is schematic diagram showing a package apparatus according to a thirteenth embodiment of the present invention. The package apparatus 40E is structured similar to the package apparatus 40D shown in FIG. 4D, whereas the second surface 304 of the first wiring layer 300 of the package apparatus 30E is disposed lower than the dielectric material layer 320, but is different in that: the first surface 342 of the second conductive pillar layer 340 is disposed coplanar with the first molding compound layer 350 while allowing the first molding compound layer 350 to be formed covering all the surfaces of the second conductive pillar layer 340, but is not limited thereby.

Figure 4F:
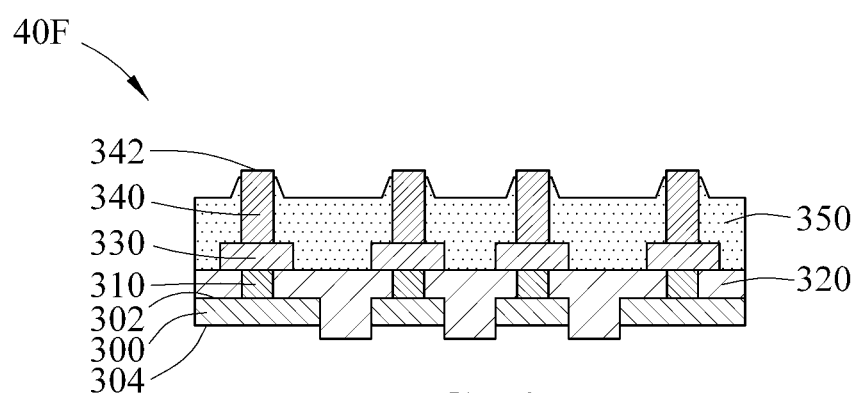
FIG. 4F is schematic diagram showing a package apparatus according to a fourteenth embodiment of the present invention.

Please refer to FIG. 4F, which is schematic diagram showing a package apparatus according to a fourteenth embodiment of the present invention. The package apparatus 40F is structured similar to the package apparatus 40D shown in FIG. 4D, whereas the second surface 304 of the first wiring layer 300 of the package apparatus 30E is disposed lower than the dielectric material layer 320, but is different in that: the first surface 342 of the second conductive pillar layer 340 is disposed higher than the first molding compound layer 350 while allowing the first molding compound layer 350 to be formed covering a specific portion of the surfaces of the second conductive pillar layer 340, but is not limited thereby.

Figure 4G:
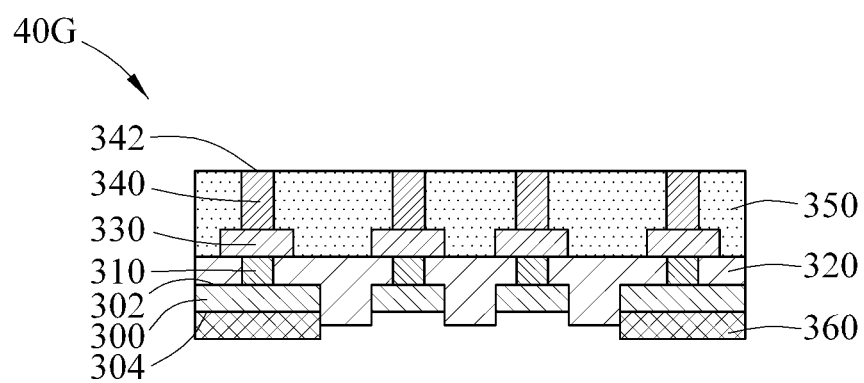
FIG. 4G is schematic diagram showing a package apparatus according to a fifteenth embodiment of the present invention.

Please refer to FIG. 4G, which is schematic diagram showing a package apparatus according to a fifteenth embodiment of the present invention. In this embodiment, the package apparatus 40G is basically formed as the package apparatus 40A shown in FIG. 4A, but with an additional solder resist layer 360 that is being formed and disposed on the second surface 304 of the first conductive wiring layer 300 and the dielectric material layer 320, while allowing a portion of the first conductive wiring layer 300 and a portion of the dielectric material layer 320 to be exposed for packaging, but it is noted limited thereby. It is noted that the structure shown in this embodiment employs a non-solder mask design (NSMD), by which only a portion of the first conductive wiring layer 300 and the consequent dielectric material layer 320 are exposed for packaging, the rest of the first conductive wiring layer 300 and the dielectric material layer 320 are covered and protected by the solder resist layer 360.

Figure 4H:
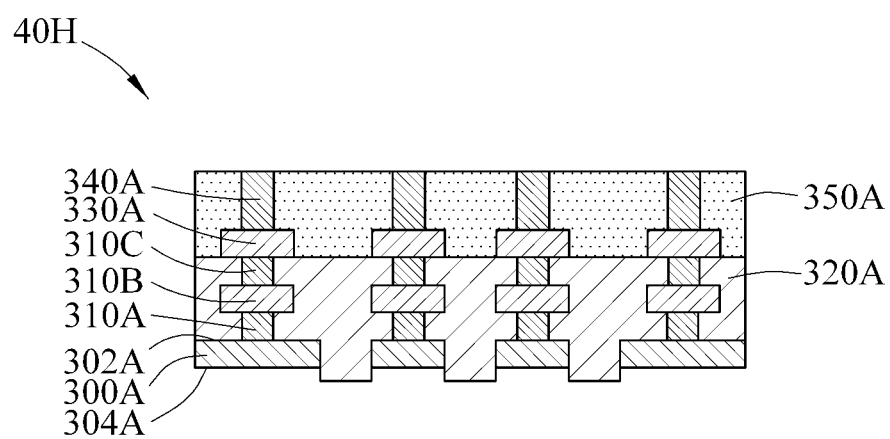
FIG. 4H is schematic diagram showing a package apparatus according to a sixteenth embodiment of the present invention.

Please refer to FIG. 4H, which is schematic diagram showing a package apparatus according to a sixteenth embodiment of the present invention. In FIG. 4H, a package apparatus 40H is disclosed, which comprises: a first conductive wiring layer 300A, a first conductive pillar layer 310A, a second conductive wiring layer 310B, a second conductive pillar layer 310C, a dielectric material layer 320A, a third conductive wiring layer 330A, a third conductive pillar layer 340A and a first molding compound layer 350A. The first conductive wiring layer 300A is formed with a first surface 302A and a second surface 304A that are arranged opposite to each other, and in an embodiment, the first conductive wiring layer 300A can be a wiring layer with patterns which includes at least one wire or at least one chip seat. In addition, the first conductive pillar layer 310A is disposed on the first surface 302A of the first conductive wiring layer 300A, the second conductive wiring layer 310B is disposed on the first conductive pillar layer 310A, and the second conductive pillar layer 310C is disposed on the second conductive wiring layer 310B, while allowing the first conductive wiring layer 300A, the first conductive pillar layer 310A, the second conductive wiring layer 310B and the second conductive pillar layer 310C to be disposed inside the dielectric material layer 320A. It is noted that the dielectric material layer 320A can be made of a thermosetting substance or a photo-sensitive substance, whichever is composed of a resin material, a silicon nitride material or a silicon oxide material, but is not limited thereby.

The third conductive wiring layer 330A is disposed on the second conductive pillar layer 310C and the third conductive pillar layer 340A is disposed on the third conductive wiring layer 330A. Similarly, the third conductive pillar layer 340A can be a wiring layer with patterns which includes at least one wire or at least one chip seat, whereas in this embodiment, the third conductive pillar layer 340A is a ball grid array (BGA) electrode layer. In addition, the third conductive wiring layer 330A and the third conductive pillar layer 340A are disposed inside the first molding compound layer 350A, whereas the first molding compound layer 350A is made of a molding compound material for chip packaging and is composed of a material selected from the group consisting of novolac-based resin, epoxy-based resin, silicon-based resign and other molding compounds, but is not limited thereby.

It is noted that the package apparatus 40H is formed basically the same as the package apparatus 40A shown in the ninth embodiment, but is different in that: the first conductive pillar layer 310 in the package apparatus 40A is replaced by the cooperation of the first conductive pillar layer 310A, the second conductive wiring layer 310B and the second conductive pillar layer 310C in the package apparatus 40H.

Figure 5A:
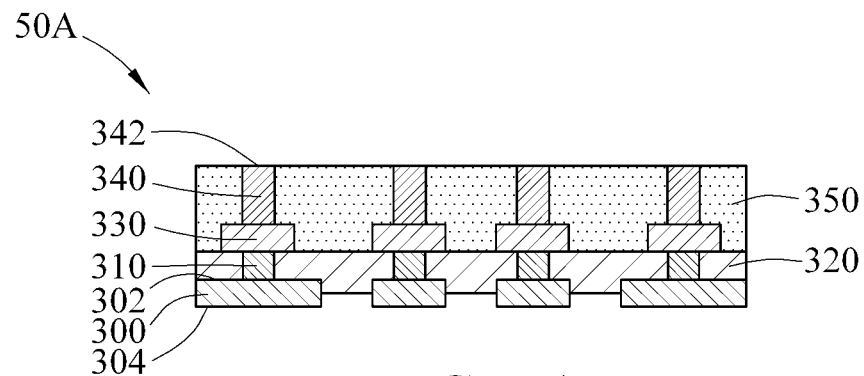
FIG. 5A is schematic diagram showing a package apparatus according to a seventeenth embodiment of the present invention.

Please refer to FIG. 5A, which is schematic diagram showing a package apparatus according to a seventeenth embodiment of the present invention. The package apparatus 50A of FIG. 5A is structured similar to the package apparatus 30A of the first embodiment, but is different in that: the second surface 304 of the first wiring layer 300 of the package apparatus 50A is disposed higher than the dielectric material layer 320, but still the first surface 342 of the second conductive pillar layer 340 is disposed coplanar with the first molding compound layer 350, but is not limited thereby.

Figure 5B:
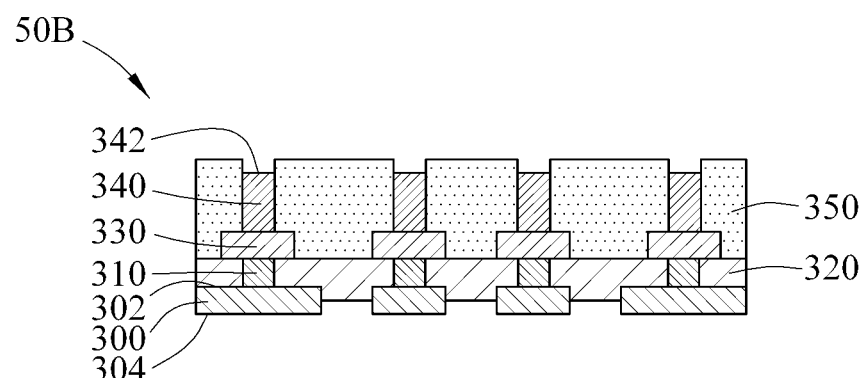
FIG. 5B is schematic diagram showing a package apparatus according to an eighteenth embodiment of the present invention.

Please refer to FIG. 5B, which is schematic diagram showing a package apparatus according to an eighteenth embodiment of the present invention. The package apparatus 50B of FIG. 5B is structured similar to the package apparatus 50A of the seventeenth embodiment, whereas the second surface 304 of the first wiring layer 300 of the package apparatus 50B is disposed higher than the dielectric material layer 320, but is different in that: the first surface 342 of the second conductive pillar layer 340 is disposed lower than the first molding compound layer 350, but is not limited thereby.

Figure 5C:
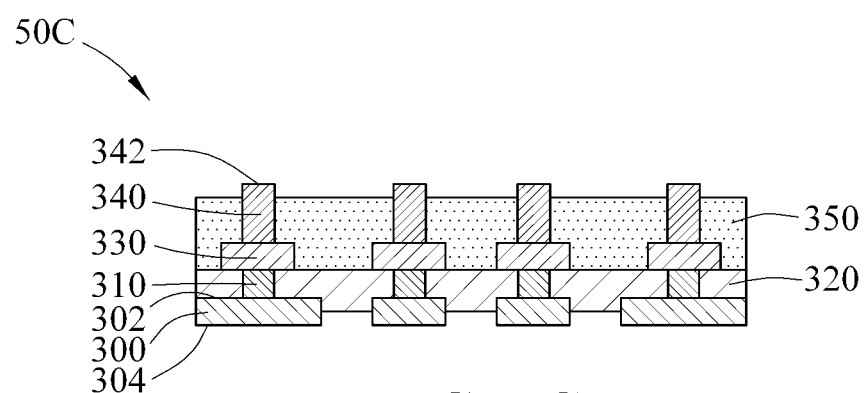
FIG. 5C is schematic diagram showing a package apparatus according to a nineteenth embodiment of the present invention.

Please refer to FIG. 5C, which is schematic diagram showing a package apparatus according to a nineteenth embodiment of the present invention. The package apparatus 50C of FIG. 5C is structured similar to the package apparatus 50A of the seventeenth embodiment, whereas the second surface 304 of the first wiring layer 300 of the package apparatus 50B is disposed higher than the dielectric material layer 320, but is different in that: the first surface 342 of the second conductive pillar layer 340 is disposed higher than the first molding compound layer 350, but is not limited thereby.

Figure 5D:
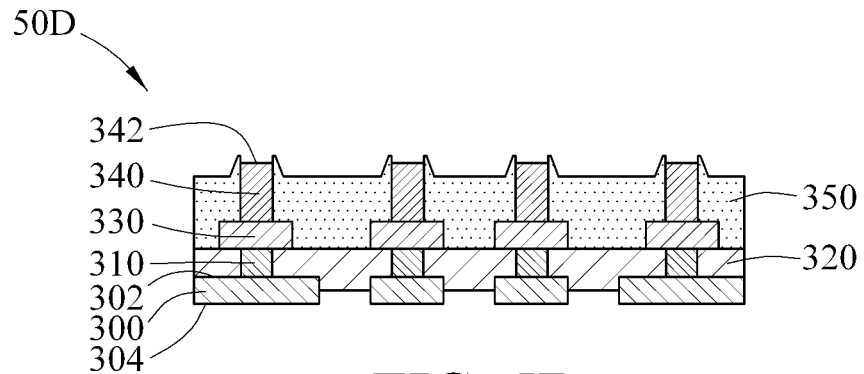
FIG. 5D is schematic diagram showing a package apparatus according to a twentieth embodiment of the present invention.

Please refer to FIG. 5D, which is schematic diagram showing a package apparatus according to a twentieth embodiment of the present invention. The package apparatus 50D of FIG. 5D is structured similar to the package apparatus 50A of the seventeenth embodiment, whereas the second surface 304 of the first wiring layer 300 of the package apparatus 50B is disposed higher than the dielectric material layer 320, but is different in that: the first surface 342 of the second conductive pillar layer 340 is disposed lower than the first molding compound layer 350, while allowing the first molding compound layer 350 to be formed covering all the surfaces of the second conductive pillar layer 340, but is not limited thereby.

Figure 5E:
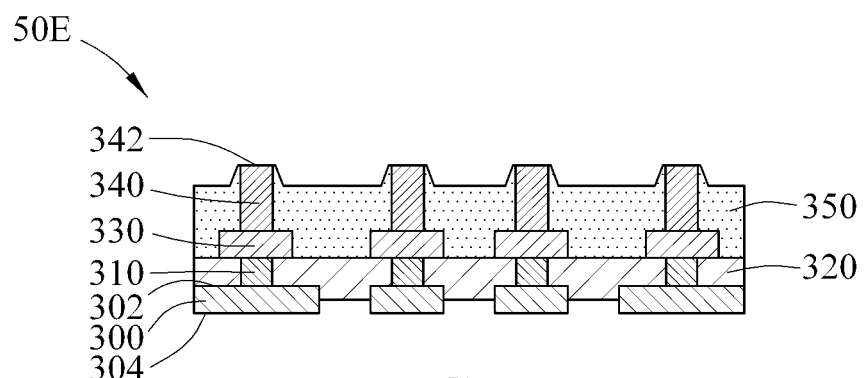
FIG. 5E is schematic diagram showing a package apparatus according to a twenty-first embodiment of the present invention.

Please refer to FIG. 5E, which is schematic diagram showing a package apparatus according to a twenty-first embodiment of the present invention. The package apparatus 50E of FIG. 5E is structured similar to the package apparatus 50D of the twentieth embodiment, whereas the second surface 304 of the first wiring layer 300 of the package apparatus 50B is disposed higher than the dielectric material layer 320, but is different in that: the first surface 342 of the second conductive pillar layer 340 is disposed coplanar with the first molding compound layer 350, while allowing the first molding compound layer 350 to be formed covering all the surfaces of the second conductive pillar layer 340, but is not limited thereby.

Figure 5F:
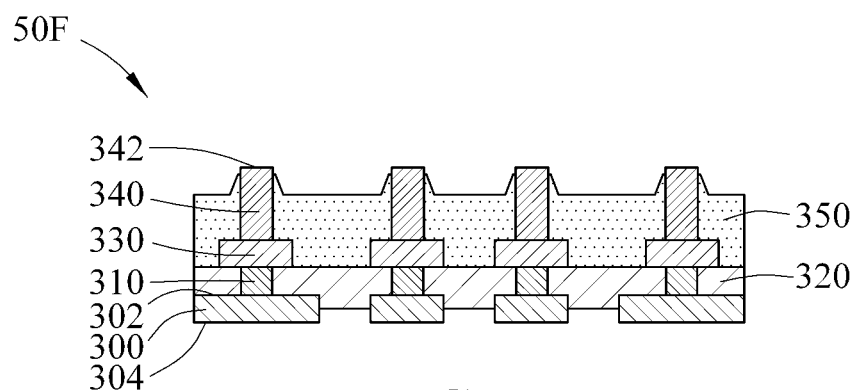
FIG. 5F is schematic diagram showing a package apparatus according to a twenty-second embodiment of the present invention.

Please refer to FIG. 5F, which is schematic diagram showing a package apparatus according to a twenty-second embodiment of the present invention. The package apparatus 50F of FIG. 5F is structured similar to the package apparatus 50F of the twentieth embodiment, whereas the second surface 304 of the first wiring layer 300 of the package apparatus 50B is disposed higher than the dielectric material layer 320, but is different in that: the first surface 342 of the second conductive pillar layer 340 is disposed higher than the first molding compound layer 350, while allowing the first molding compound layer 350 to be formed covering a specific portion of the surfaces of the second conductive pillar layer 340, but is not limited thereby.

Figure 5G:
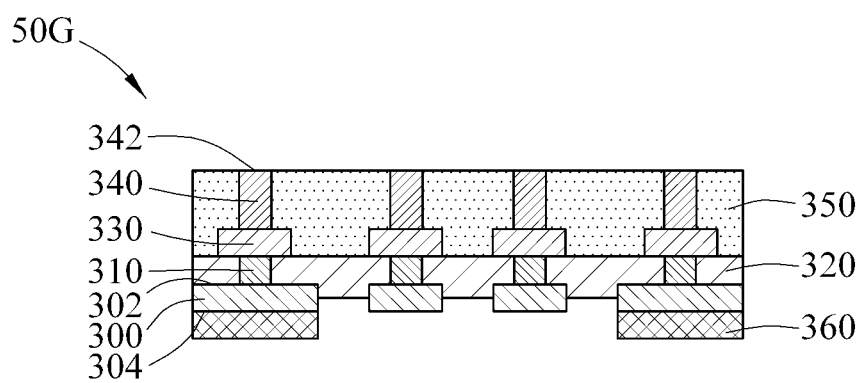
FIG. 5G is schematic diagram showing a package apparatus according to a twenty-third embodiment of the present invention.

Please refer to FIG. 5G, which is schematic diagram showing a package apparatus according to a twenty-third embodiment of the present invention. In this embodiment, the package apparatus 50G is basically formed as the package apparatus 50A of the seventeenth embodiment, but with an additional solder resist layer 360 that is being formed and disposed on the second surface 304 of the first conductive wiring layer 300 and the dielectric material layer 320, while allowing a portion of the first conductive wiring layer 300 and a portion of the dielectric material layer 320 to be exposed for packaging, but it is noted limited thereby. It is noted that the structure shown in this embodiment employs a non-solder mask design (NSMD), by which only a portion of the first conductive wiring layer 300 and the consequent dielectric material layer 320 are exposed for packaging, the rest of the first conductive wiring layer 300 and the dielectric material layer 320 are covered and protected by the solder resist layer 360.

Figure 5H:
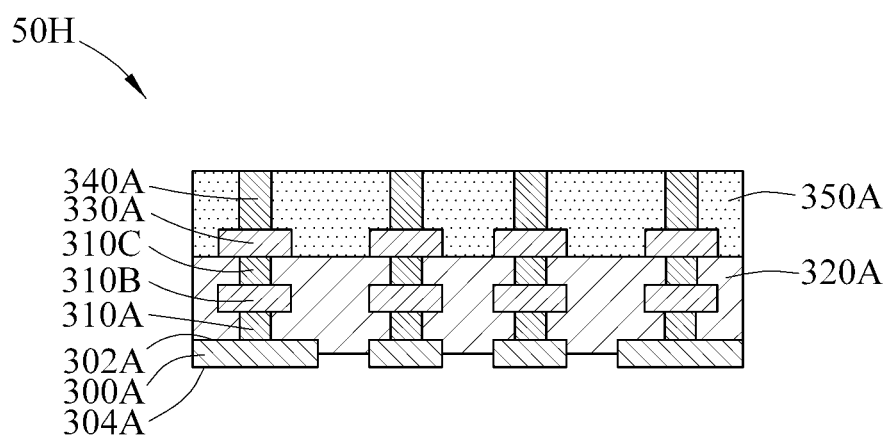
FIG. 5H is schematic diagram showing a package apparatus according to a twenty-fourth embodiment of the present invention.

Please refer to FIG. 5H, which is schematic diagram showing a package apparatus according to a twenty-fourth embodiment of the present invention. In FIG. 5H, a package apparatus 40H is disclosed, which comprises: a first conductive wiring layer 300A, a first conductive pillar layer 310A, a second conductive wiring layer 310B, a second conductive pillar layer 310C, a dielectric material layer 320A, a third conductive wiring layer 330A, a third conductive pillar layer 340A and a first molding compound layer 350A. The first conductive wiring layer 300A is formed with a first surface 302A and a second surface 304A that are arranged opposite to each other, and in an embodiment, the first conductive wiring layer 300A can be a wiring layer with patterns which includes at least one wire or at least one chip seat. In addition, the first conductive pillar layer 310A is disposed on the first surface 302A of the first conductive wiring layer 300A, the second conductive wiring layer 310B is disposed on the first conductive pillar layer 310A, and the second conductive pillar layer 310C is disposed on the second conductive wiring layer 310B, while allowing the first conductive wiring layer 300A, the first conductive pillar layer 310A, the second conductive wiring layer 310B and the second conductive pillar layer 310C to be disposed inside the dielectric material layer 320A. It is noted that the dielectric material layer 320A can be made of a thermosetting substance or a photo-sensitive substance, whichever is composed of a resin material, a silicon nitride material or a silicon oxide material, but is not limited thereby.

The third conductive wiring layer 330A is disposed on the second conductive pillar layer 310C and the dielectric material layer 320A, while the third conductive pillar layer 340A is disposed on the third conductive wiring layer 330A. Similarly, the third conductive pillar layer 340A can be a wiring layer with patterns which includes at least one wire or at least one chip seat, whereas in this embodiment, the third conductive pillar layer 340A is a ball grid array (BGA) electrode layer. In addition, the third conductive wiring layer 330A and the third conductive pillar layer 340A are disposed inside the first molding compound layer 350A, whereas the first molding compound layer 350A is made of a molding compound material for chip packaging and is composed of a material selected from the group consisting of novolac-based resin, epoxy-based resin, silicon-based resign and other molding compounds, but is not limited thereby.

It is noted that the package apparatus 50H is formed basically the same as the package apparatus 40A shown in the seventeenth embodiment, but is different in that: the first conductive pillar layer 310 in the package apparatus 50A is replaced by the cooperation of the first conductive pillar layer 310A, the second conductive wiring layer 310B and the second conductive pillar layer 310C in the package apparatus 50H.

Figure 6A:
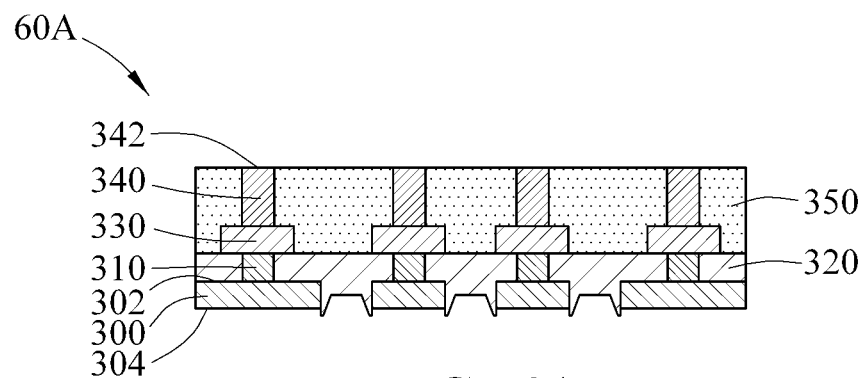
FIG. 6A is schematic diagram showing a package apparatus according to a twenty-fifth embodiment of the present invention.

Please refer to FIG. 6A, which is schematic diagram showing a package apparatus according to a twenty-fifth embodiment of the present invention. The package apparatus 60A of FIG. 6A is structured similar to the package apparatus 30A of the first embodiment, but is different in that: the second surface 304 of the first wiring layer 300 of the package apparatus 50A is disposed lower than the dielectric material layer 320, while allowing the dielectric material layer 320 to be formed covering all the surfaces of the first conductive wiring layer 300, but still enabling the first surface 342 of the second conductive pillar layer 340 to be disposed coplanar with the first molding compound layer 350, but is not limited thereby.

Figure 6B:
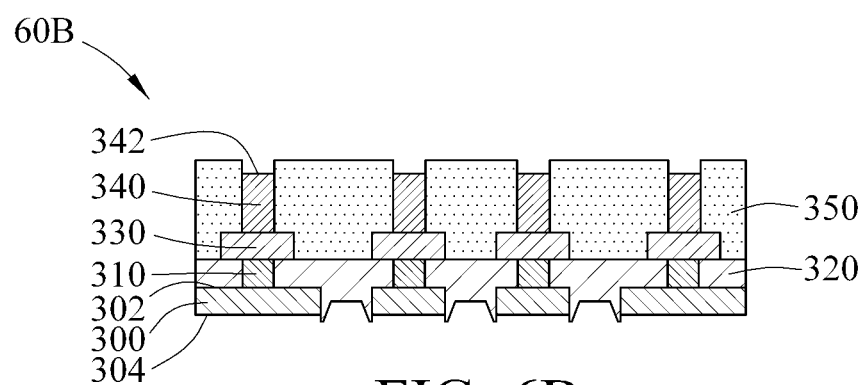
FIG. 6B is schematic diagram showing a package apparatus according to a twenty-sixth embodiment of the present invention.

Please refer to FIG. 6B, which is schematic diagram showing a package apparatus according to a twenty-sixth embodiment of the present invention. The package apparatus 60B of FIG. 6B is structured similar to the package apparatus 60A of the twenty-fifth embodiment, whereas the second surface 304 of the first wiring layer 300 of the package apparatus 60B is disposed lower than the dielectric material layer 320 while allowing the dielectric material layer 320 to be formed covering all the surfaces of the first conductive wiring layer 300, but is different in that: the first surface 342 of the second conductive pillar layer 340 is disposed lower than the first molding compound layer 350, but is not limited thereby.

Figure 6C:
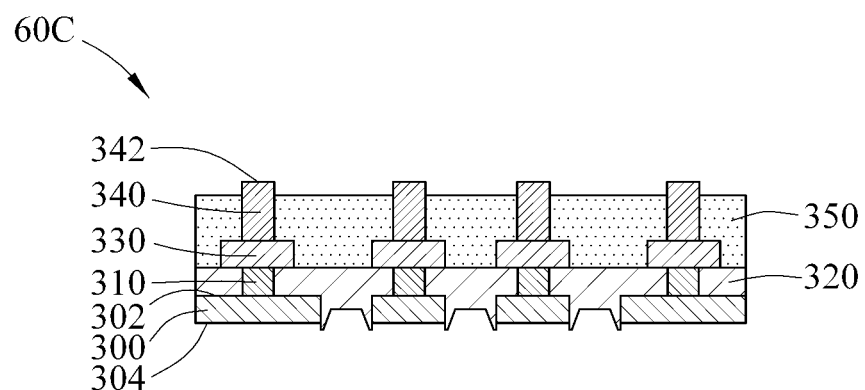
FIG. 6C is schematic diagram showing a package apparatus according to a twenty-seventh embodiment of the present invention.

Please refer to FIG. 6C, which is schematic diagram showing a package apparatus according to a twenty-seventh embodiment of the present invention. The package apparatus 60C of FIG. 6C is structured similar to the package apparatus 60A of the twenty-fifth embodiment, whereas the second surface 304 of the first wiring layer 300 of the package apparatus 60C is disposed lower than the dielectric material layer 320 while allowing the dielectric material layer 320 to be formed covering all the surfaces of the first conductive wiring layer 300, but is different in that: the first surface 342 of the second conductive pillar layer 340 is disposed higher than the first molding compound layer 350, but is not limited thereby.

Figure 6D:
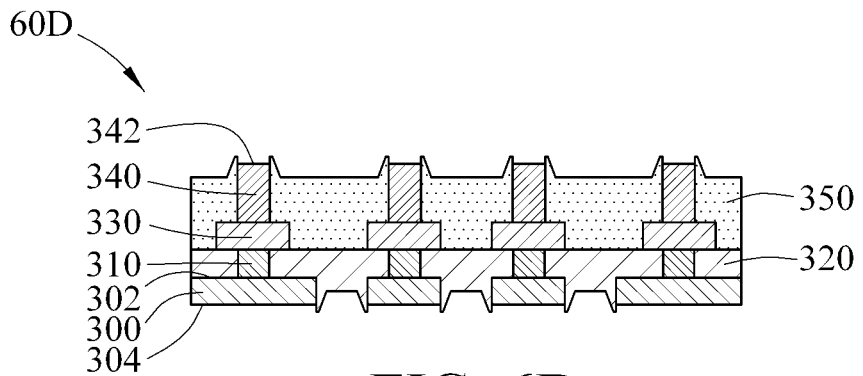
FIG. 6D is schematic diagram showing a package apparatus according to a twenty-eighth embodiment of the present invention.

Please refer to FIG. 6D, which is schematic diagram showing a package apparatus according to a twenty-eighth embodiment of the present invention. The package apparatus 60D of FIG. 6D is structured similar to the package apparatus 60A of the twenty-fifth embodiment, whereas the second surface 304 of the first wiring layer 300 of the package apparatus 60B is disposed lower than the dielectric material layer 320 while allowing the dielectric material layer 320 to be formed covering all the surfaces of the first conductive wiring layer 300, but is different in that: the first surface 342 of the second conductive pillar layer 340 is disposed lower than the first molding compound layer 350 while allowing the first molding compound layer 350 to be formed covering all the surfaces of the second conductive wiring layer 340, but is not limited thereby.

Figure 6E:
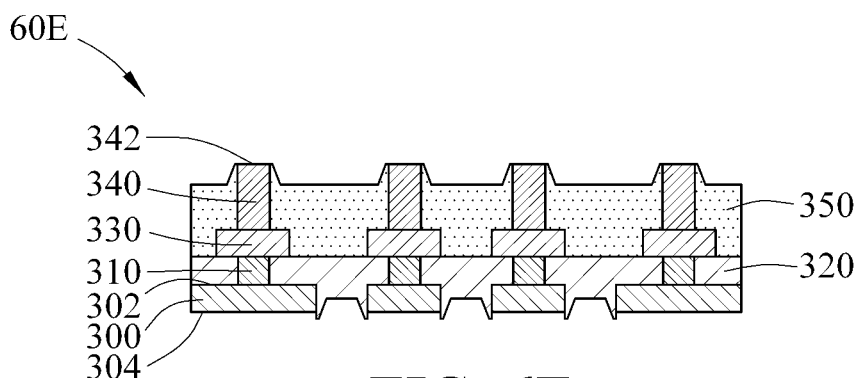
FIG. 6E is schematic diagram showing a package apparatus according to a twenty-ninth embodiment of the present invention.

Please refer to FIG. 6E, which is schematic diagram showing a package apparatus according to a twenty-ninth embodiment of the present invention. The package apparatus 60E of FIG. 6E is structured similar to the package apparatus 60D of the twenty-eighth embodiment, whereas the second surface 304 of the first wiring layer 300 of the package apparatus 60E is disposed lower than the dielectric material layer 320 while allowing the dielectric material layer 320 to be formed covering all the surfaces of the first conductive wiring layer 300, but is different in that: the first surface 342 of the second conductive pillar layer 340 is disposed coplanar with the first molding compound layer 350 while allowing the first molding compound layer 350 to be formed covering all the surfaces of the second conductive wiring layer 340, but is not limited thereby.

Figure 6F:
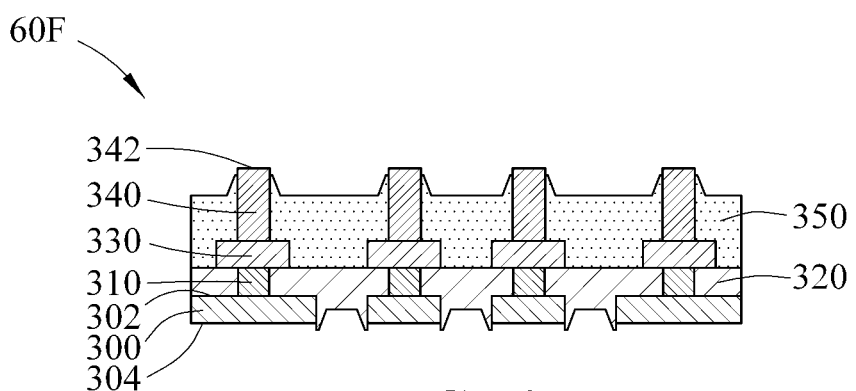
FIG. 6F is schematic diagram showing a package apparatus according to a thirtieth embodiment of the present invention.

Please refer to FIG. 6F, which is schematic diagram showing a package apparatus according to a thirtieth embodiment of the present invention. The package apparatus 60F of FIG. 6F is structured similar to the package apparatus 60D of the twenty-eighth embodiment, whereas the second surface 304 of the first wiring layer 300 of the package apparatus 60E is disposed lower than the dielectric material layer 320 while allowing the dielectric material layer 320 to be formed covering all the surfaces of the first conductive wiring layer 300, but is different in that: the first surface 342 of the second conductive pillar layer 340 is disposed higher than the first molding compound layer 350 while allowing the first molding compound layer 350 to be formed covering a specific portion of the surfaces of the second conductive wiring layer 340, but is not limited thereby.

Figure 6G:
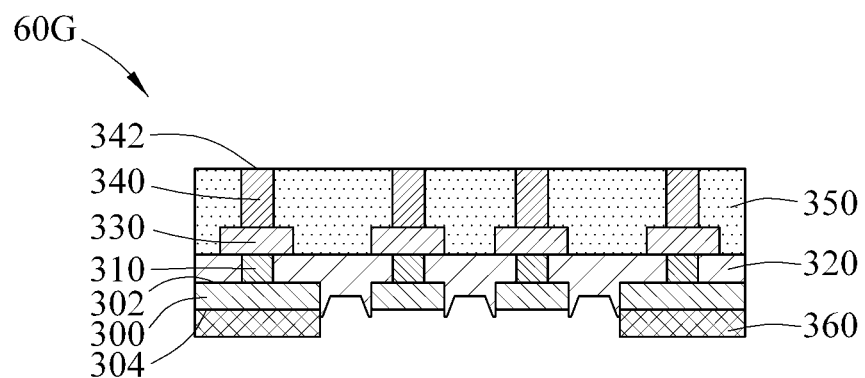
FIG. 6G is schematic diagram showing a package apparatus according to a thirty-first embodiment of the present invention.

Please refer to FIG. 6G, which is schematic diagram showing a package apparatus according to a thirty-first embodiment of the present invention. In this embodiment, the package apparatus 60G is basically formed as the package apparatus 60A of the twenty-fifth embodiment, but with an additional solder resist layer 360 that is being formed and disposed on the second surface 304 of the first conductive wiring layer 300 and the dielectric material layer 320, while allowing a portion of the first conductive wiring layer 300 and a portion of the dielectric material layer 320 to be exposed for packaging, but it is noted limited thereby. It is noted that the structure shown in this embodiment employs a non-solder mask design (NSMD), by which only a portion of the first conductive wiring layer 300 and the consequent dielectric material layer 320 are exposed for packaging, the rest of the first conductive wiring layer 300 and the dielectric material layer 320 are covered and protected by the solder resist layer 360.

Figure 6H:
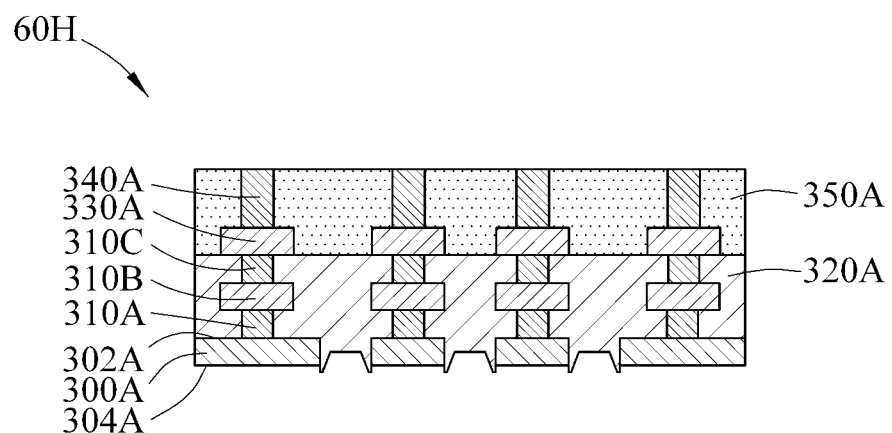
FIG. 6H is schematic diagram showing a package apparatus according to a thirty-second embodiment of the present invention.

Please refer to FIG. 6H, which is schematic diagram showing a package apparatus according to a thirty-second embodiment of the present invention. In FIG. 6H, a package apparatus 60H is disclosed, which comprises: a first conductive wiring layer 300A, a first conductive pillar layer 310A, a second conductive wiring layer 310B, a second conductive pillar layer 310C, a dielectric material layer 320A, a third conductive wiring layer 330A, a third conductive pillar layer 340A and a first molding compound layer 350A. The first conductive wiring layer 300A is formed with a first surface 302A and a second surface 304A that are arranged opposite to each other, and in an embodiment, the first conductive wiring layer 300A can be a wiring layer with patterns which includes at least one wire or at least one chip seat. In addition, the first conductive pillar layer 310A is disposed on the first surface 302A of the first conductive wiring layer 300A, the second conductive wiring layer 310B is disposed on the first conductive pillar layer 310A, and the second conductive pillar layer 310C is disposed on the second conductive wiring layer 310B, while allowing the first conductive wiring layer 300A, the first conductive pillar layer 310A, the second conductive wiring layer 310B and the second conductive pillar layer 310C to be disposed inside the dielectric material layer 320A. It is noted that the dielectric material layer 320A can be made of a thermosetting substance or a photo-sensitive substance, whichever is composed of a resin material, a silicon nitride material or a silicon oxide material, but is not limited thereby.

The third conductive wiring layer 330A is disposed on the second conductive pillar layer 310C and the dielectric material layer 320A, while the third conductive pillar layer 340A is disposed on the third conductive wiring layer 330A. Similarly, the third conductive pillar layer 340A can be a wiring layer with patterns which includes at least one wire or at least one chip seat, whereas in this embodiment, the third conductive pillar layer 340A is a ball grid array (BGA) electrode layer. In addition, the third conductive wiring layer 330A and the third conductive pillar layer 340A are disposed inside the first molding compound layer 350A, whereas the first molding compound layer 350A is made of a molding compound material for chip packaging and is composed of a material selected from the group consisting of novolac-based resin, epoxy-based resin, silicon-based resign and other molding compounds, but is not limited thereby.

It is noted that the package apparatus 60H is formed basically the same as the package apparatus 60A shown in the twenty-fifth embodiment, but is different in that: the first conductive pillar layer 310 in the package apparatus 60A is replaced by the cooperation of the first conductive pillar layer 310A, the second conductive wiring layer 310B and the second conductive pillar layer 310C in the package apparatus 60H.

Figure 7A:
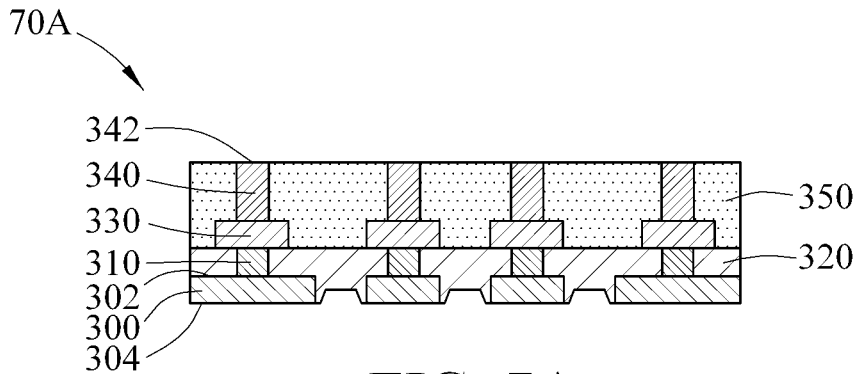
FIG. 7A is schematic diagram showing a package apparatus according to a thirty-third embodiment of the present invention.

Please refer to FIG. 7A, which is schematic diagram showing a package apparatus according to a thirty-third embodiment of the present invention. The package apparatus 70A of FIG. 7A is structured similar to the package apparatus 30A of the first embodiment, but is different in that: the second surface 304 of the first wiring layer 300 of the package apparatus 70A is disposed coplanar with the dielectric material layer 320, while allowing the dielectric material layer 320 to be formed covering all the surfaces of the first conductive wiring layer 300, but still enabling the first surface 342 of the second conductive pillar layer 340 to be disposed coplanar with the first molding compound layer 350, but is not limited thereby.

Figure 7B:
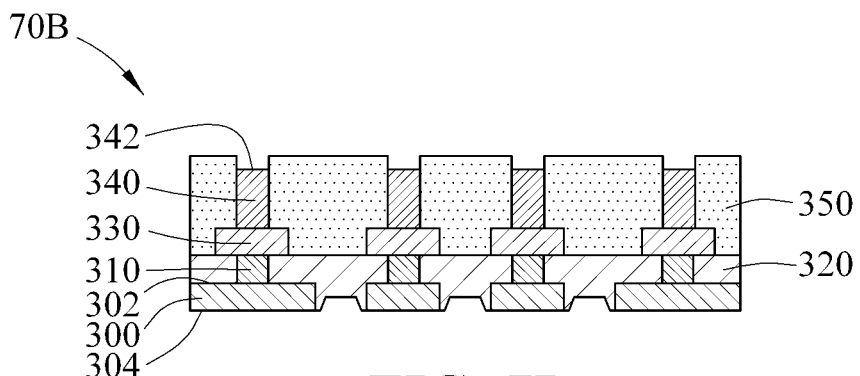
FIG. 7B is schematic diagram showing a package apparatus according to a thirty-fourth embodiment of the present invention.

Please refer to FIG. 7B, which is schematic diagram showing a package apparatus according to a thirty-fourth embodiment of the present invention. The package apparatus 70B of FIG. 7B is structured similar to the package apparatus 70A of the thirty-third embodiment, whereas the second surface 304 of the first wiring layer 300 of the package apparatus 70B is disposed coplanar with the dielectric material layer 320 while allowing the dielectric material layer 320 to be formed covering all the surfaces of the first conductive wiring layer 300, but is different in that: the first surface 342 of the second conductive pillar layer 340 is disposed lower than the first molding compound layer 350, but is not limited thereby.

Figure 7C:
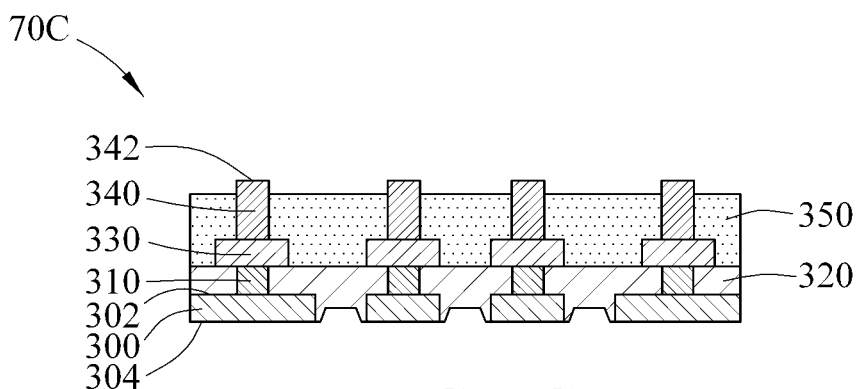
FIG. 7C is schematic diagram showing a package apparatus according to a thirty-fifth embodiment of the present invention.

Please refer to FIG. 7C, which is schematic diagram showing a package apparatus according to a thirty-fifth embodiment of the present invention. The package apparatus 70C of FIG. 7C is structured similar to the package apparatus 70A of the thirty-third embodiment, whereas the second surface 304 of the first wiring layer 300 of the package apparatus 70C is disposed coplanar with the dielectric material layer 320 while allowing the dielectric material layer 320 to be formed covering all the surfaces of the first conductive wiring layer 300, but is different in that: the first surface 342 of the second conductive pillar layer 340 is disposed higher than the first molding compound layer 350, but is not limited thereby.

Figure 7D:
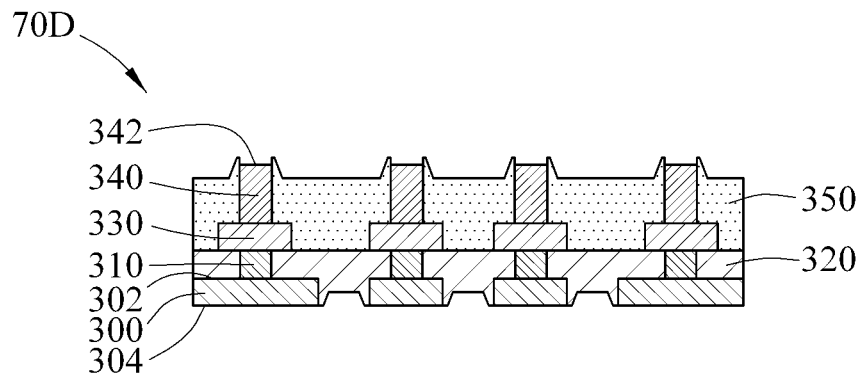
FIG. 7D is schematic diagram showing a package apparatus according to a thirty-sixth embodiment of the present invention.

Please refer to FIG. 7D, which is schematic diagram showing a package apparatus according to a thirty-sixth embodiment of the present invention. The package apparatus 70D of FIG. 7D is structured similar to the package apparatus 70A of the thirty-third embodiment, whereas the second surface 304 of the first wiring layer 300 of the package apparatus 70D is disposed coplanar with the dielectric material layer 320 while allowing the dielectric material layer 320 to be formed covering all the surfaces of the first conductive wiring layer 300, but is different in that: the first surface 342 of the second conductive pillar layer 340 is disposed lower than the first molding compound layer 350 while allowing the second conductive pillar layer 340 to be formed covering all the surfaces of the second conductive pillar layer 340, but is not limited thereby.

Figure 7E:
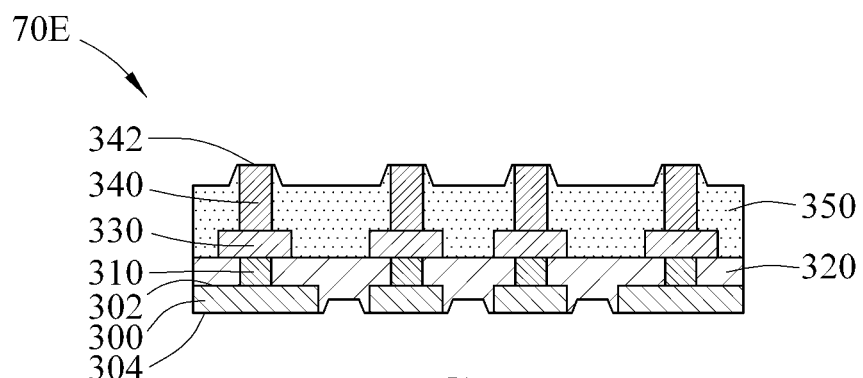
FIG. 7E is schematic diagram showing a package apparatus according to a thirty-seventh embodiment of the present invention.

Please refer to FIG. 7E, which is schematic diagram showing a package apparatus according to a thirty-seventh embodiment of the present invention. The package apparatus 70E of FIG. 7E is structured similar to the package apparatus 70D of the thirty-sixth embodiment, whereas the second surface 304 of the first wiring layer 300 of the package apparatus 70E is disposed coplanar with the dielectric material layer 320 while allowing the dielectric material layer 320 to be formed covering all the surfaces of the first conductive wiring layer 300, but is different in that: the first surface 342 of the second conductive pillar layer 340 is disposed coplanar with the first molding compound layer 350 while allowing the second conductive pillar layer 340 to be formed covering all the surfaces of the second conductive pillar layer 340, but is not limited thereby.

Figure 7F:
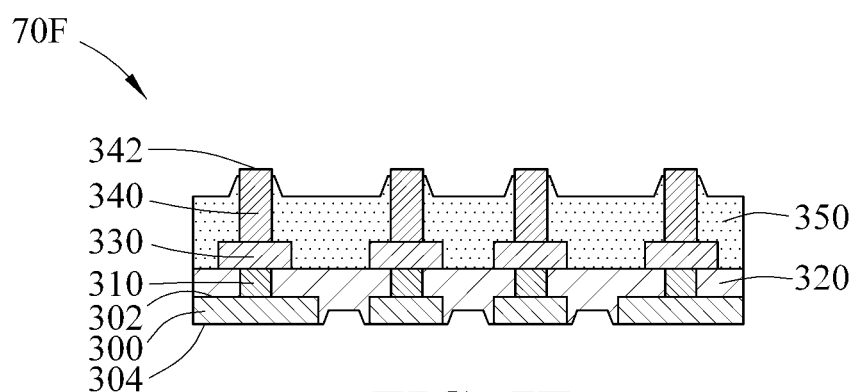
FIG. 7F is schematic diagram showing a package apparatus according to a thirty-eighth embodiment of the present invention.

Please refer to FIG. 7F, which is schematic diagram showing a package apparatus according to a thirty-eighth embodiment of the present invention. The package apparatus 70F of FIG. 7F is structured similar to the package apparatus 70D of the thirty-sixth embodiment, whereas the second surface 304 of the first wiring layer 300 of the package apparatus 70F is disposed coplanar with the dielectric material layer 320 while allowing the dielectric material layer 320 to be formed covering all the surfaces of the first conductive wiring layer 300, but is different in that: the first surface 342 of the second conductive pillar layer 340 is disposed higher than the first molding compound layer 350 while allowing the second conductive pillar layer 340 to be formed covering a specific portion of the surfaces of the second conductive pillar layer 340, but is not limited thereby.

Figure 7G:
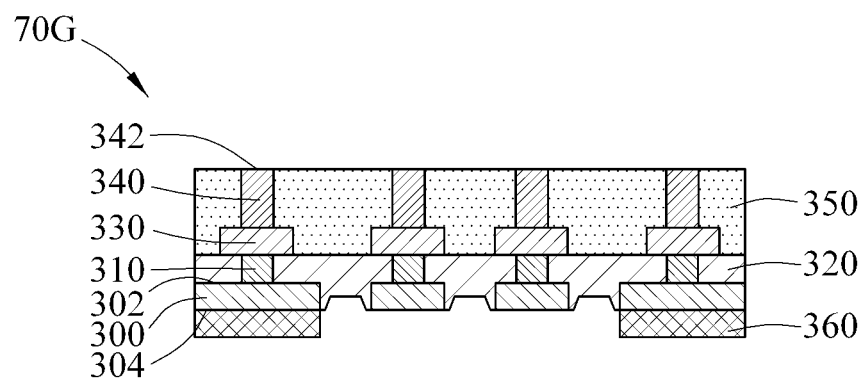
FIG. 7G is schematic diagram showing a package apparatus according to a thirty-ninth embodiment of the present invention.

Please refer to FIG. 7G, which is schematic diagram showing a package apparatus according to a thirty-ninth embodiment of the present invention. In this embodiment, the package apparatus 70G is basically formed as the package apparatus 70A of the thirty-third embodiment, but with an additional solder resist layer 360 that is being formed and disposed on the second surface 304 of the first conductive wiring layer 300 and the dielectric material layer 320, while allowing a portion of the first conductive wiring layer 300 and a portion of the dielectric material layer 320 to be exposed for packaging, but it is noted limited thereby. It is noted that the structure shown in this embodiment employs a non-solder mask design (NSMD), by which only a portion of the first conductive wiring layer 300 and the consequent dielectric material layer 320 are exposed for packaging, the rest of the first conductive wiring layer 300 and the dielectric material layer 320 are covered and protected by the solder resist layer 360.

Figure 7H:
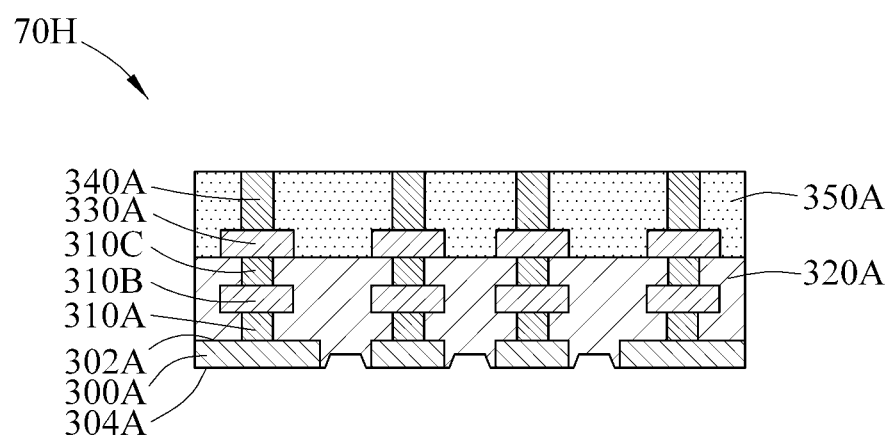
FIG. 7H is schematic diagram showing a package apparatus according to a fortieth embodiment of the present invention.

Please refer to FIG. 7H, which is schematic diagram showing a package apparatus according to a fortieth embodiment of the present invention. In FIG. 7H, a package apparatus 70H is disclosed, which comprises: a first conductive wiring layer 300A, a first conductive pillar layer 310A, a second conductive wiring layer 310B, a second conductive pillar layer 310C, a dielectric material layer 320A, a third conductive wiring layer 330A, a third conductive pillar layer 340A and a first molding compound layer 350A. The first conductive wiring layer 300A is formed with a first surface 302A and a second surface 304A that are arranged opposite to each other, and in an embodiment, the first conductive wiring layer 300A can be a wiring layer with patterns which includes at least one wire or at least one chip seat. In addition, the first conductive pillar layer 310A is disposed on the first surface 302A of the first conductive wiring layer 300A, the second conductive wiring layer 310B is disposed on the first conductive pillar layer 310A, and the second conductive pillar layer 310C is disposed on the second conductive wiring layer 310B, while allowing the first conductive wiring layer 300A, the first conductive pillar layer 310A, the second conductive wiring layer 310B and the second conductive pillar layer 310C to be disposed inside the dielectric material layer 320A. It is noted that the dielectric material layer 320A can be made of a thermosetting substance or a photo-sensitive substance, whichever is composed of a resin material, a silicon nitride material or a silicon oxide material, but is not limited thereby.

The third conductive wiring layer 330A is disposed on the second conductive pillar layer 310C and the dielectric material layer 320A, while the third conductive pillar layer 340A is disposed on the third conductive wiring layer 330A. Similarly, the third conductive pillar layer 340A can be a wiring layer with patterns which includes at least one wire or at least one chip seat, whereas in this embodiment, the third conductive pillar layer 340A is a ball grid array (BGA) electrode layer. In addition, the third conductive wiring layer 330A and the third conductive pillar layer 340A are disposed inside the first molding compound layer 350A, whereas the first molding compound layer 350A is made of a molding compound material for chip packaging and is composed of a material selected from the group consisting of novolac-based resin, epoxy-based resin, silicon-based resign and other molding compounds, but is not limited thereby.

It is noted that the package apparatus 70H is formed basically the same as the package apparatus 70A shown in the thirty-third embodiment, but is different in that: the first conductive pillar layer 310 in the package apparatus 70A is replaced by the cooperation of the first conductive pillar layer 310A, the second conductive wiring layer 310B and the second conductive pillar layer 310C in the package apparatus 60H.

Figure 8A:
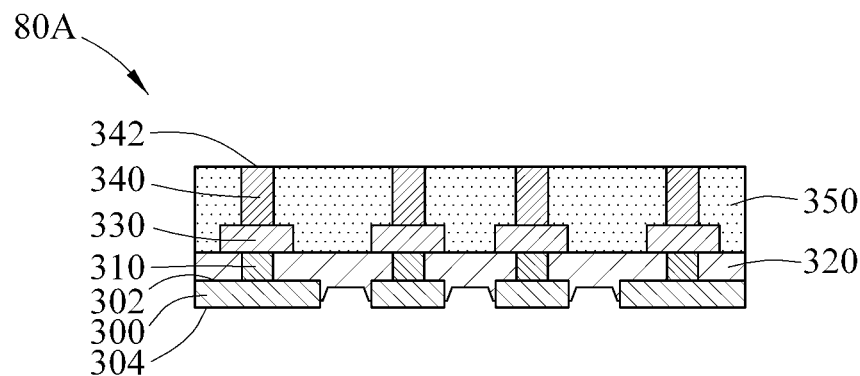
FIG. 8A is schematic diagram showing a package apparatus according to a forty-first embodiment of the present invention.

Please refer to FIG. 8A, which is schematic diagram showing a package apparatus according to a forty-first embodiment of the present invention. The package apparatus 80A of FIG. 8A is structured similar to the package apparatus 30A of the first embodiment, but is different in that: the second surface 304 of the first wiring layer 300 of the package apparatus 80A is disposed higher than the dielectric material layer 320, while allowing the dielectric material layer 320 to be formed covering all the surfaces of the first conductive wiring layer 300, but still enabling the first surface 342 of the second conductive pillar layer 340 to be disposed coplanar with the first molding compound layer 350, but is not limited thereby.

Figure 8B:
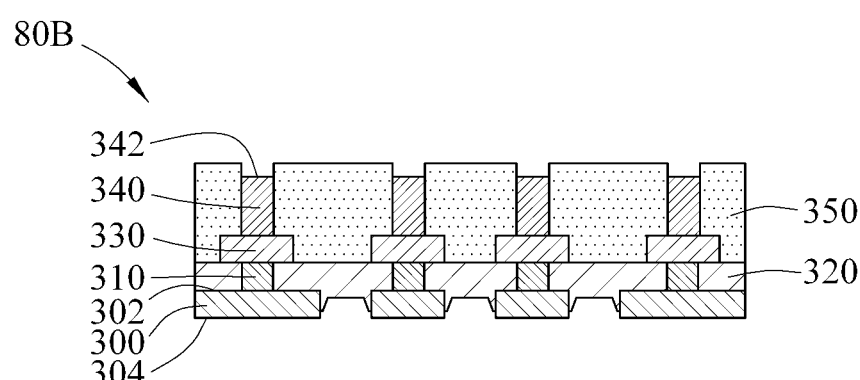
FIG. 8B is schematic diagram showing a package apparatus according to a forty-second embodiment of the present invention.

Please refer to FIG. 8B, which is schematic diagram showing a package apparatus according to a forty-second embodiment of the present invention. The package apparatus 80B of FIG. 8B is structured similar to the package apparatus 80A of the forty-first embodiment, whereas the second surface 304 of the first wiring layer 300 of the package apparatus 80B is disposed higher than the dielectric material layer 320 while allowing the dielectric material layer 320 to be formed covering all the surfaces of the first conductive wiring layer 300, but is different in that: the first surface 342 of the second conductive pillar layer 340 is disposed lower than the first molding compound layer 350, but is not limited thereby.

Figure 8C:
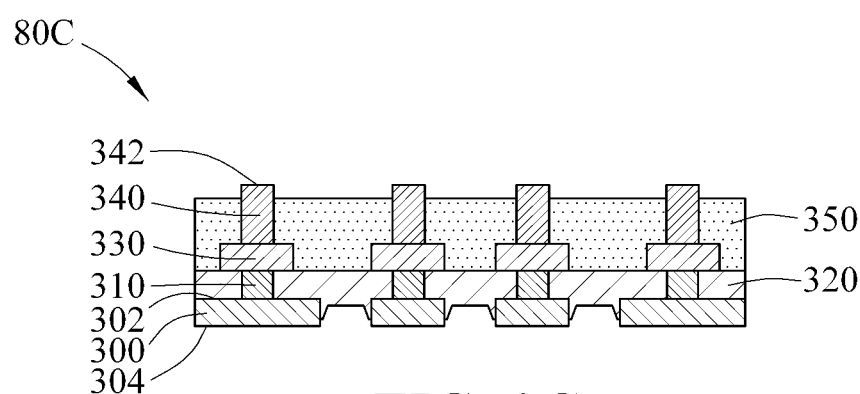
FIG. 8C is schematic diagram showing a package apparatus according to a forty-third embodiment of the present invention.

Please refer to FIG. 8C, which is schematic diagram showing a package apparatus according to a forty-third embodiment of the present invention. The package apparatus 80C of FIG. 8C is structured similar to the package apparatus 80A of the forty-first embodiment, whereas the second surface 304 of the first wiring layer 300 of the package apparatus 80D is disposed higher than the dielectric material layer 320 while allowing the dielectric material layer 320 to be formed covering all the surfaces of the first conductive wiring layer 300, but is different in that: the first surface 342 of the second conductive pillar layer 340 is disposed higher than the first molding compound layer 350, but is not limited thereby.

Figure 8D:
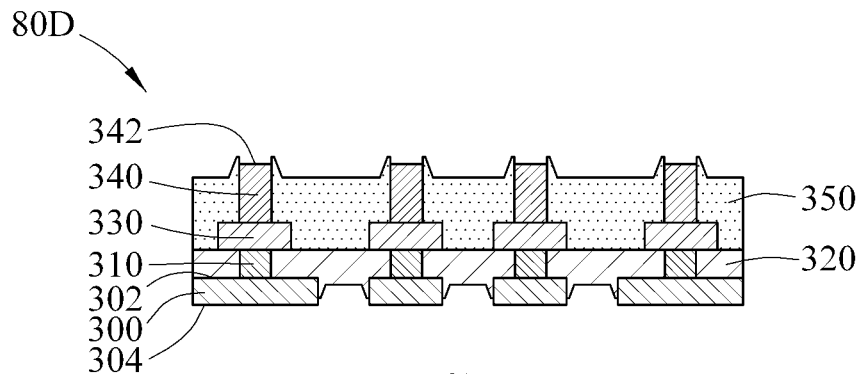
FIG. 8D is schematic diagram showing a package apparatus according to a forty-fourth embodiment of the present invention.

Please refer to FIG. 8D, which is schematic diagram showing a package apparatus according to a forty-fourth embodiment of the present invention. The package apparatus 80D of FIG. 8D is structured similar to the package apparatus 80A of the forty-first embodiment, whereas the second surface 304 of the first wiring layer 300 of the package apparatus 80D is disposed higher than the dielectric material layer 320 while allowing the dielectric material layer 320 to be formed covering all the surfaces of the first conductive wiring layer 300, but is different in that: the first surface 342 of the second conductive pillar layer 340 is disposed lower than the first molding compound layer 350 while allowing the first molding compound layer 350 to be formed covering all the surfaces of the second conductive pillar layer 340, but is not limited thereby.

Figure 8E:
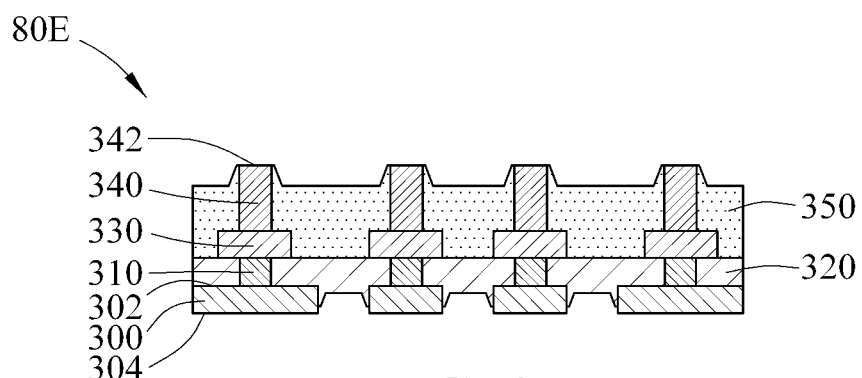
FIG. 8E is schematic diagram showing a package apparatus according to a forty-fifth embodiment of the present invention.

Please refer to FIG. 8E, which is schematic diagram showing a package apparatus according to a forty-fifth embodiment of the present invention. The package apparatus 80E of FIG. 8E is structured similar to the package apparatus 80D of the forty-fourth embodiment, whereas the second surface 304 of the first wiring layer 300 of the package apparatus 80E is disposed higher than the dielectric material layer 320 while allowing the dielectric material layer 320 to be formed covering all the surfaces of the first conductive wiring layer 300, but is different in that: the first surface 342 of the second conductive pillar layer 340 is disposed coplanar with the first molding compound layer 350 while allowing the first molding compound layer 350 to be formed covering all the surfaces of the second conductive pillar layer 340, but is not limited thereby.

Figure 8F:
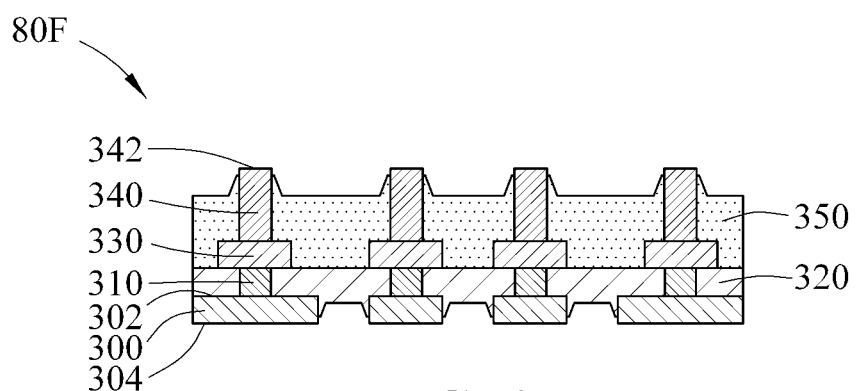
FIG. 8F is schematic diagram showing a package apparatus according to a forty-sixth embodiment of the present invention.

Please refer to FIG. 8F, which is schematic diagram showing a package apparatus according to a forty-sixth embodiment of the present invention. The package apparatus 80F of FIG. 8F is structured similar to the package apparatus 80D of the forty-fourth embodiment, whereas the second surface 304 of the first wiring layer 300 of the package apparatus 80F is disposed higher than the dielectric material layer 320 while allowing the dielectric material layer 320 to be formed covering all the surfaces of the first conductive wiring layer 300, but is different in that: the first surface 342 of the second conductive pillar layer 340 is disposed higher than the first molding compound layer 350 while allowing the first molding compound layer 350 to be formed covering a specific portion of the surfaces of the second conductive pillar layer 340, but is not limited thereby.

Figure 8G:
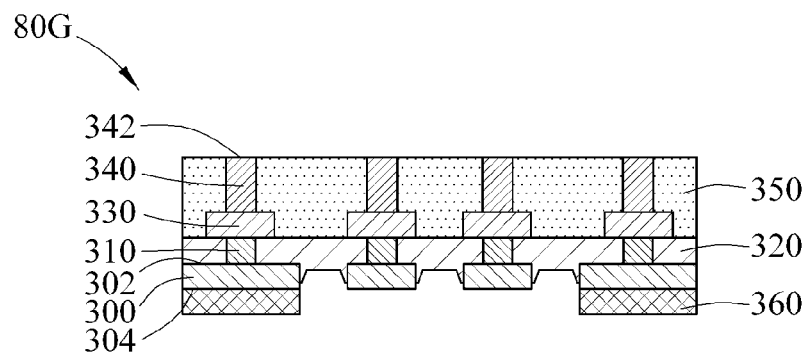
FIG. 8G is schematic diagram showing a package apparatus according to a forty-seventh embodiment of the present invention.

Please refer to FIG. 8G, which is schematic diagram showing a package apparatus according to a forty-seventh embodiment of the present invention. In this embodiment, the package apparatus 80G is basically formed as the package apparatus 80A of the forty-first embodiment, but with an additional solder resist layer 360 that is being formed and disposed on the second surface 304 of the first conductive wiring layer 300 and the dielectric material layer 320, while allowing a portion of the first conductive wiring layer 300 and a portion of the dielectric material layer 320 to be exposed for packaging, but it is noted limited thereby. It is noted that the structure shown in this embodiment employs a non-solder mask design (NSMD), by which only a portion of the first conductive wiring layer 300 and the consequent dielectric material layer 320 are exposed for packaging, the rest of the first conductive wiring layer 300 and the dielectric material layer 320 are covered and protected by the solder resist layer 360.

Figure 8H:
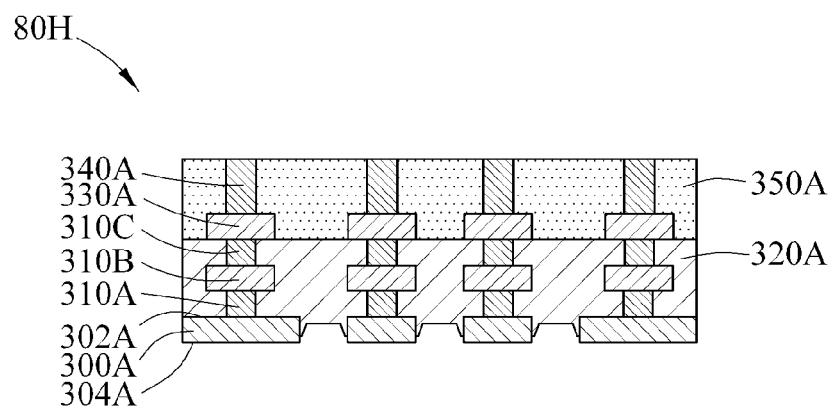
FIG. 8H is schematic diagram showing a package apparatus according to a forty-eighth embodiment of the present invention.

Please refer to FIG. 8H, which is schematic diagram showing a package apparatus according to a forty-eighth embodiment of the present invention. In FIG. 8H, a package apparatus 80H is disclosed, which comprises: a first conductive wiring layer 300A, a first conductive pillar layer 310A, a second conductive wiring layer 310B, a second conductive pillar layer 310C, a dielectric material layer 320A, a third conductive wiring layer 330A, a third conductive pillar layer 340A and a first molding compound layer 350A. The first conductive wiring layer 300A is formed with a first surface 302A and a second surface 304A that are arranged opposite to each other, and in an embodiment, the first conductive wiring layer 300A can be a wiring layer with patterns which includes at least one wire or at least one chip seat. In addition, the first conductive pillar layer 310A is disposed on the first surface 302A of the first conductive wiring layer 300A, the second conductive wiring layer 310B is disposed on the first conductive pillar layer 310A, and the second conductive pillar layer 310C is disposed on the second conductive wiring layer 310B, while allowing the first conductive wiring layer 300A, the first conductive pillar layer 310A, the second conductive wiring layer 310B and the second conductive pillar layer 310C to be disposed inside the dielectric material layer 320A. It is noted that the dielectric material layer 320A can be made of a thermosetting substance or a photo-sensitive substance, whichever is composed of a resin material, a silicon nitride material or a silicon oxide material, but is not limited thereby.

The third conductive wiring layer 330A is disposed on the second conductive pillar layer 310C and the dielectric material layer 320A, while the third conductive pillar layer 340A is disposed on the third conductive wiring layer 330A. Similarly, the third conductive pillar layer 340A can be a wiring layer with patterns which includes at least one wire or at least one chip seat, whereas in this embodiment, the third conductive pillar layer 340A is a ball grid array (BGA) electrode layer. In addition, the third conductive wiring layer 330A and the third conductive pillar layer 340A are disposed inside the first molding compound layer 350A, whereas the first molding compound layer 350A is made of a molding compound material for chip packaging and is composed of a material selected from the group consisting of novolac-based resin, epoxy-based resin, silicon-based resign and other molding compounds, but is not limited thereby.

It is noted that the package apparatus 80H is formed basically the same as the package apparatus 80A shown in the forty-first embodiment, but is different in that: the first conductive pillar layer 310 in the package apparatus 80A is replaced by the cooperation of the first conductive pillar layer 310A, the second conductive wiring layer 310B and the second conductive pillar layer 310C in the package apparatus 80H.

Figure 9:
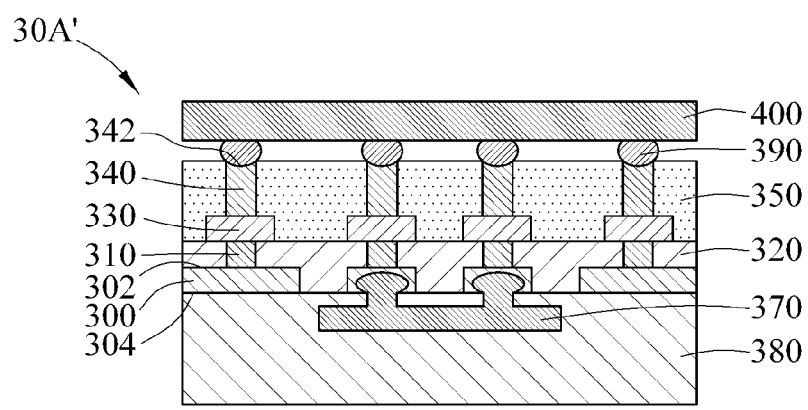
FIG. 9 is schematic diagram showing a posterior package apparatus of the first embodiment of the present invention.

FIG. 9 is schematic diagram showing a posterior package apparatus of the first embodiment of the present invention. In FIG. 9, the posterior package apparatus 30A further comprises: a first external unit 370, a second molding compound layer 380, a plurality of first conducting units 390 and a second external unit 400. Wherein, the first external unit 370 is disposed on and electrically connected to the second surface of the first conductive wiring layer 300; the second molding compound layer 380 is disposed on the first external unit 370 and the second surface 304 of the first conductive wiring layer 300 while allowing the first external unit 370 to be disposed inside the second molding compound layer 380. In addition, the plural first conducting units are disposed on the second conductive pillar layer 340, and the second external unit 400 is disposed on and electrically connected to the plural first conducting units 390. In an embodiment, each of the first external unit 370 and the second external unit 400 can be a unit selected from the group consisting of: an active component, a passive element, a semiconductor chip, a flexible circuitboard and a printed circuitboard, but is not limited thereby. Moreover, the other aforesaid package apparatuses 30B~30H can be manufactured and structured the same as the posterior package apparatus 30A shown in FIG. 9, and thus further description will not be provided herein.

Figure 10:
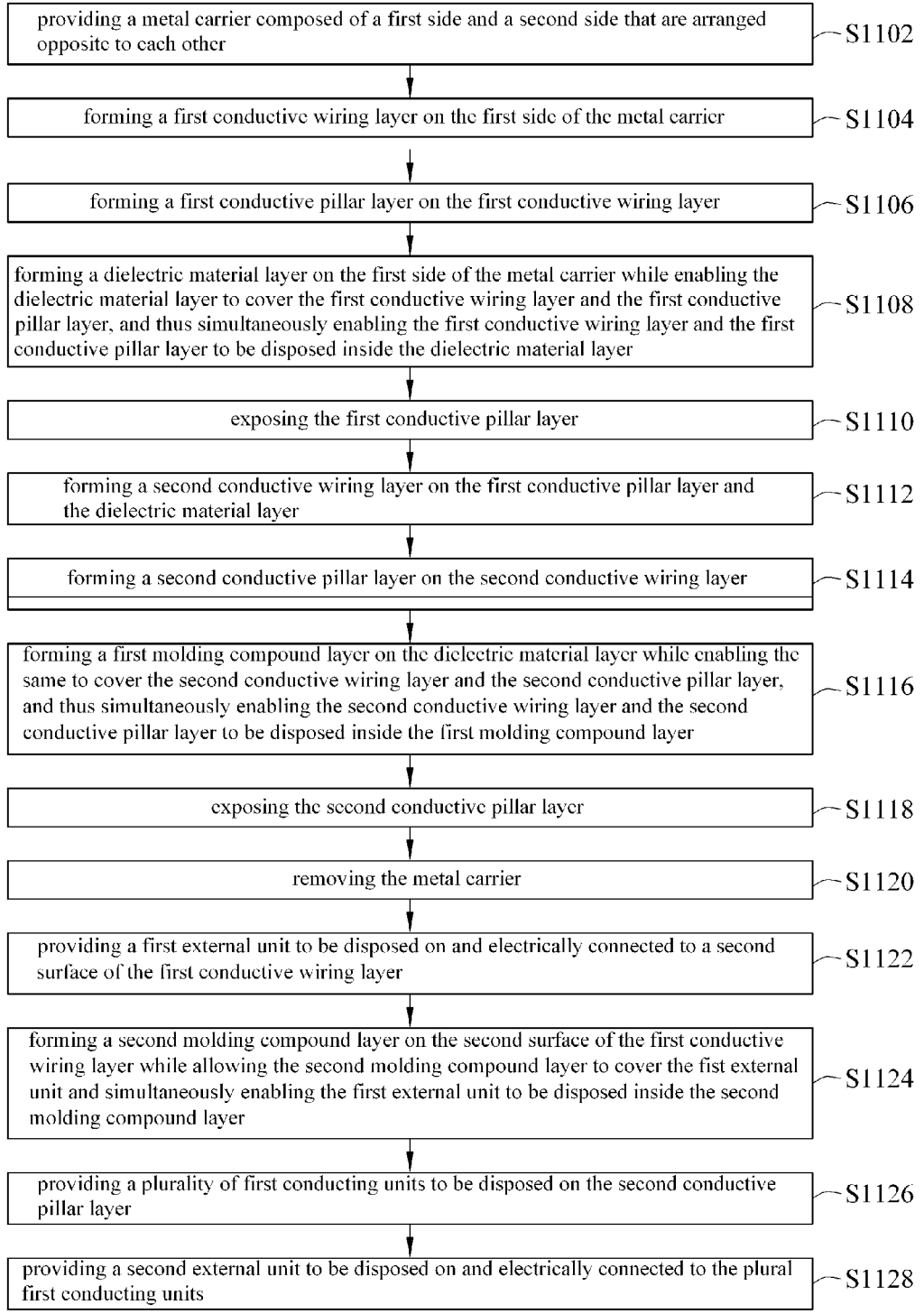
FIG. 10 is a flow chart depicting steps performing in a method for manufacturing a package apparatus of the first embodiment of the present invention.
Figure 11A:
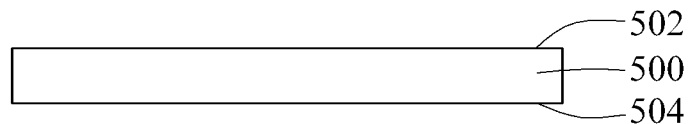
FIG. 11A to FIG. 11N are schematic diagrams illustrating the manufacturing of the package apparatus of the first embodiment.
Figure 11B:
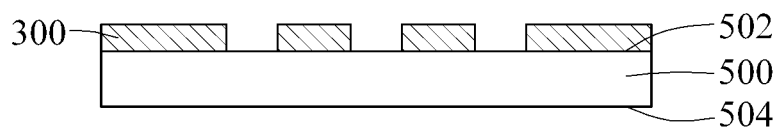
Figure 11C:
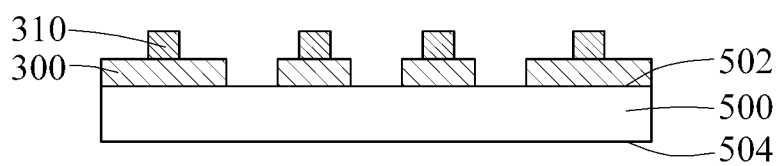
Figure 11D:
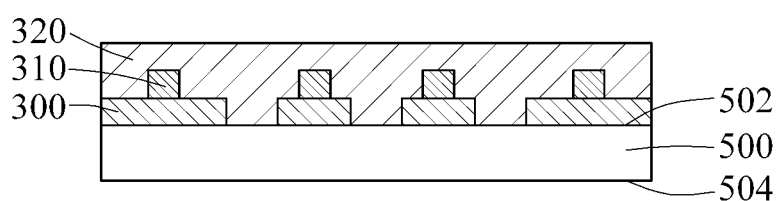
Figure 11E:
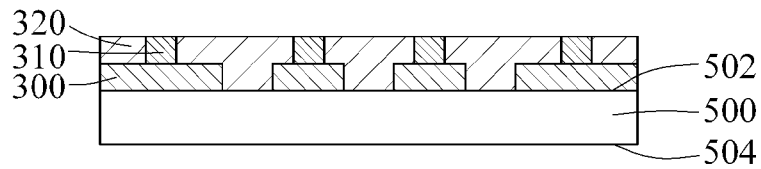
Figure 11F:
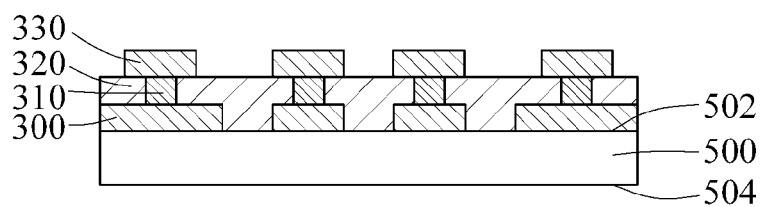
Figure 11G:
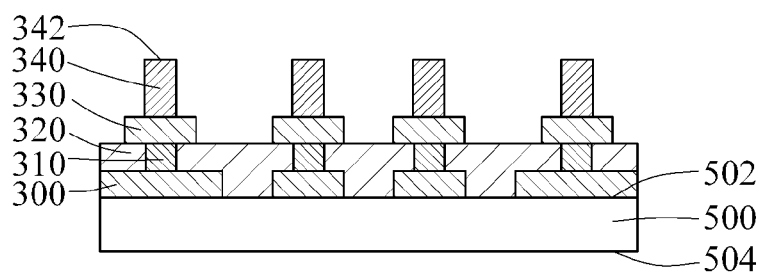
Figure 11H:
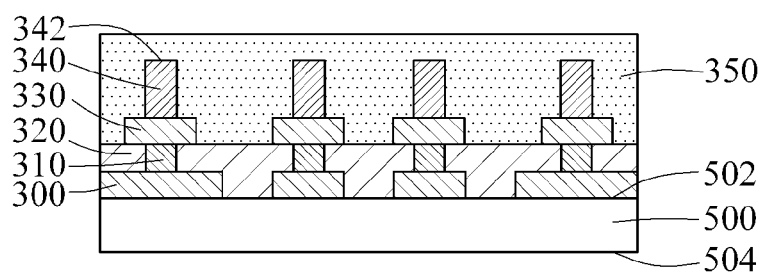
Figure 11I:
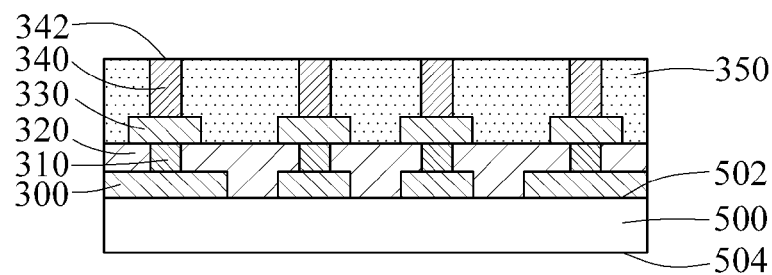
Figure 11J:
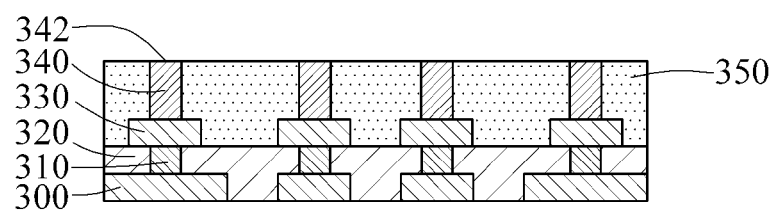
Figure 11K:
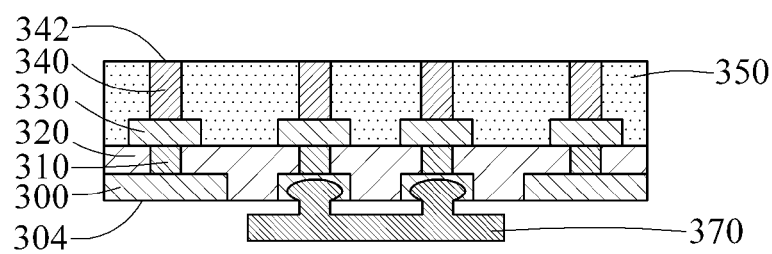
Figure 11L:
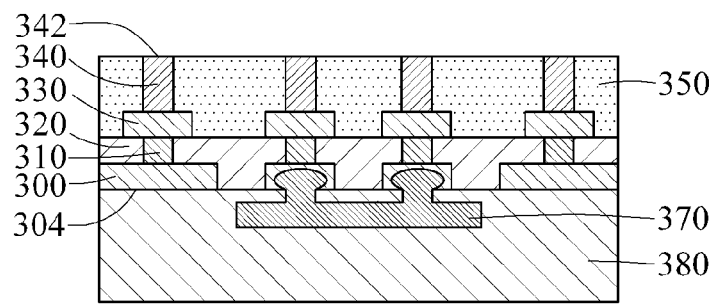
Figure 11M:
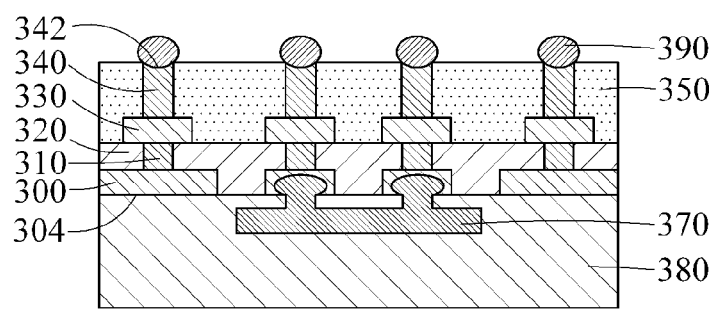
Figure 11N:
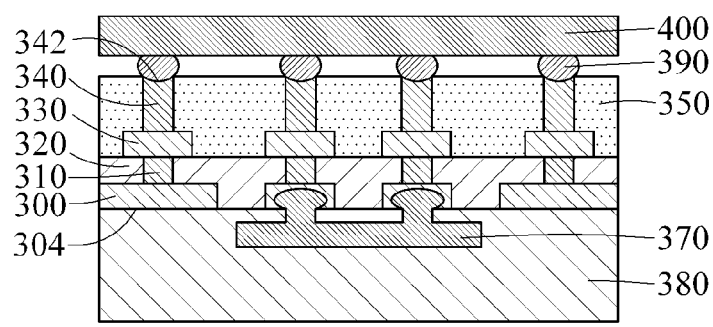

FIG. 10 is a flow chart depicting steps performing in a method for manufacturing a package apparatus of the first embodiment. FIG. 11A to FIG. 11N are schematic diagrams illustrating the manufacturing of a package apparatus of the first embodiment. As shown in FIG. 10, a method for manufacturing the package apparatus comprises the following steps:

step S1102: providing a metal carrier 500 composed of a first side 502 and a second side 504 that are arranged opposite to each other, as shown in FIG. 11A;

step S1104: forming a first conductive wiring layer 300 on the first side 502 of the metal carrier 500, as shown in FIG. 11B, whereas the first conductive wiring layer 300 is formed using an electrolytic plating process in this embodiment, but is not limited thereby, and moreover, the first conductive wiring layer 300 can be a wiring layer with patterns which includes at least one wire or at least one chip seat, and the first wiring layer 300 can be made of a metal, such as copper;

step S1106: forming a first conductive pillar layer 310 on the first conductive wiring layer 300, as shown in FIG. 11C, whereas the first conductive pillar layer 310 is formed using an electrolytic plating process in this embodiment, but is not limited thereby, and moreover, the first conductive pillar layer 310 can be formed at a position corresponding to the wires and the chip seats of the first wiring conductive layer 300, and the first conductive pillar layer 310 can be made of a metal, such as copper;

step S1108: forming a dielectric material layer 320 on the first side 502 of the metal carrier 500 while enabling the dielectric material layer 320 to cover the first conductive wiring layer 300 and the first conductive pillar layer 310, as shown in FIG. 11D, wherein the dielectric material layer 320 can be made of a material selected from the group consisting of: a thermosetting substance, and a photo-sensitive substance, which can be a material selected from the group consisting of: a resin material, a silicon nitride material and a silicon oxide material, but is not limited thereby; and noting that, by the use of the dielectric material layer that is formed by additive layout process in the manufacturing method of the present invention for replacing the molding compound layer in a conventional molding compound substrate structure, the production cost and the production complexity are decreased as the conventional insufficient binding force issue between the first molding compound layer and the other conductive layers that is generally seen in the fabrication of fine-line products and requires to be solved by an additional dielectric material layer is eliminated;

step S1110: enabling the first conductive pillar 310 to be exposed, as shown in FIG. 11E, whereas in this embodiment, the exposing of the first conductive pillar layer 310 is enabled by grinding and removing a portion of the dielectric material layer 320, however, under ideal condition, one end of the first conductive pillar layer 310 is positioned coplanar with the dielectric material layer 320, by that the exposing of the one end of the first conductive pillar layer 310 can be achieved simultaneously with the formation of the dielectric material layer 320, and thus the process for grinding and removing of the dielectric material layer 320 can be avoided;

step S1112: forming a second conductive wiring layer 330 on the first conductive pillar layer 310 and the dielectric material layer 320, as shown in FIG. 11F, whereas the second conductive wiring layer 330 can be formed by the use of an electrolytic plating process, an electroless plating process, a sputtering coating process, or a thermal coating process, but is not limited thereby, and moreover, the second conductive wiring layer 330 can be a wiring layer with patterns which includes at least one wire or at least one chip seat, and is a layer formed at a position corresponding to the exposed end of the first conductive pillar layer 310, moreover, the second conductive wiring layer 330 can be made of a metal, such as copper;

step S1114: forming a second conductive pillar layer 340 on the second conductive wiring layer 330, as shown in FIG. 11G, whereas the second conductive pillar layer 340 can be formed by the use of an electrolytic plating process, an electroless plating process, a sputtering coating process, or a thermal coating process, but is not limited thereby, and moreover, the second conductive pillar layer 340 can be a wiring layer with patterns which includes at least one wire or at least one chip seat, and is a layer formed at a position corresponding to the second conductive wiring layer 330, moreover, the second conductive pillar layer 340 can be made of a metal, such as copper;

step S1116: forming a first molding compound layer 350 for allowing the same to cover the second conductive wiring layer 330 and the second conductive pillar layer 340 and to be disposed on the dielectric material layer 320, while enabling the second conductive wiring layer 330 and the second conductive pillar layer 340 to be disposed inside the first molding compound layer 350, as shown in FIG. 11H, whereas, in this embodiment, the first molding compound layer 350 is formed by a process selected from the group consisting of: a transfer molding process, a top molding process, a compression molding process, an injection molding process and a vacuum casting molding process, and can be made from a material selected from the group consisting of novolac-based resin, epoxy-based resin, silicon-based resign and other molding compounds, whichever can be heated to a liquid state so as to be poured on the dielectric material layer 320 for allowing the same to cover the second conductive wiring layer 330, the second conductive pillar layer 340 under a high-temperature and high-pressure condition, and thereafter, to be cured into the first molding compound layer 350, and moreover the first molding compound layer 350 can be composed of a kind of filler, such as a powdered silicon dioxide; and in another embodiment, the formation of the first molding compound layer 350 can include the steps of: providing a molding compound to be heated to a liquid state, whereas the molding compound is composed of a resin and powdered silicon dioxide; pouring the liquefied molding compound on the first side 502 of the metal carrier 500 while allowing the molding compound to cover the second conductive wiring layer 330, the second conductive pillar layer 340 and simultaneously to be disposed on the dielectric material layer 320 under a high-temperature and high-pressure condition; and curing the molding compound for enabling the same to form the first molding compound layer 350, but is not limited thereby;

step S1118: enabling the second conductive pillar 340 to be exposed, as shown in FIG. 11I, whereas in this embodiment, the exposing of the second conductive pillar layer 340 is enabled by grinding and removing a portion of the first molding compound layer 350 for exposing a first surface 342 of the second conductive pillar layer 340, however, under ideal condition, the first surface 342 of the second conductive pillar layer 340 is positioned coplanar with the first molding compound layer 350, by that the exposing of the first surface 342 of the second conductive pillar layer 340 can be achieved simultaneously with the formation of the first molding compound layer 350, and thus the process for grinding and removing of the first molding compound layer 350 can be avoided;

step S1120: removing the metal carrier 500 for exposing the wires and the chip seats of the first conductive wiring layer 300, as shown in FIG. 11J, whereas the removal of the metal carrier 500 can be performed using an etching process, or a debonding process, or even a physical process of grinding, but is not limited thereby;

step S1122: providing a first external unit 370 to be disposed on and electrically connected to a second surface 304 of the first conductive wiring layer 300, as shown in FIG. 11K, whereas, in an embodiment, the first external unit 370 can be an active component, a passive component, a semiconductor chip, a flexible circuitboard or a printed circuitboard, but is not limited thereby;

step S1124: forming a second molding compound layer 380 for allowing the same to cover the first external unit 370 while being disposed on the second surface 304 of the first conductive wiring layer 300, and simultaneously enabling the first external unit 370 to be disposed inside the second molding compound layer 380, as shown in FIG. 11L, whereas, in this embodiment, the second molding compound layer 380 is formed by a process selected from the group consisting of: a transfer molding process, a top molding process, a compression molding process, an injection molding process and a vacuum casting molding process, and can be made from a material selected from the group consisting of novolac-based resin, epoxy-based resin, silicon-based resign and other molding compounds, whichever can be heated to a liquid state so as to be poured on the second surface 304 of the first conductive wiring layer 300 while covering the first external unit 370 under a high-temperature and high-pressure condition, and thereafter, to be cured into the second molding compound layer 380, and moreover the second molding compound layer 380 can be composed of a kind of filler, such as a powder silicon dioxide;

step S1126: providing a plurality of first conducting units 390 to be disposed on the second conductive pillar layer 340, as shown in FIG. 11M; whereas each of the plural first conducting units 390 can be made of a metal, such as copper; and in this embodiment, the first surface 342 of the second conductive pillar layer 340 can be etched into an arc-shaped concave surface so as to effectively fixing the first conducting units 390, but it is not limited thereby;

step S1128: providing a second external unit 400 to be disposed on and electrically connected to plural first conducting units 390, as shown in FIG. 11N, whereas, in an embodiment, the second external unit 400 can be an active component, a passive component, a semiconductor chip, a flexible circuitboard or a printed circuitboard, but is not limited thereby.

Figure 12A:
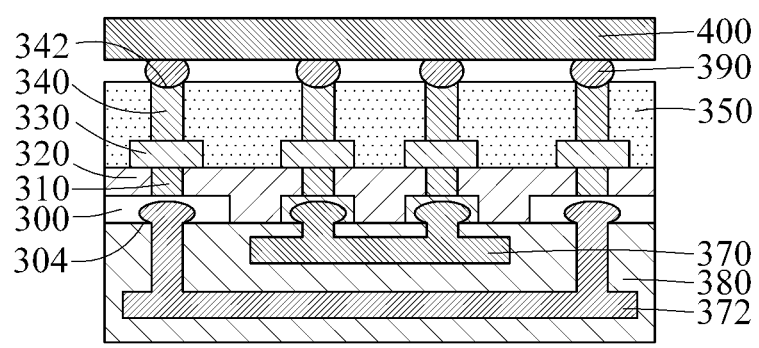
FIG. 12A is schematic diagram showing another posterior package apparatus of the first embodiment of the present invention.

Please refer to FIG. 12A, which is schematic diagram showing another posterior package apparatus of the first embodiment of the present invention. For manufacturing the package apparatus of FIG. 12A, the manufacturing method of FIG. 11 further comprises a step that is to be performed after the step S1122 and before the step S1124, which is enabled as following: providing an external unit 372 to be disposed on and electrically connected to a second surface 304 of the first conductive wiring layer 300, but is not limited thereby.

Figure 12B:
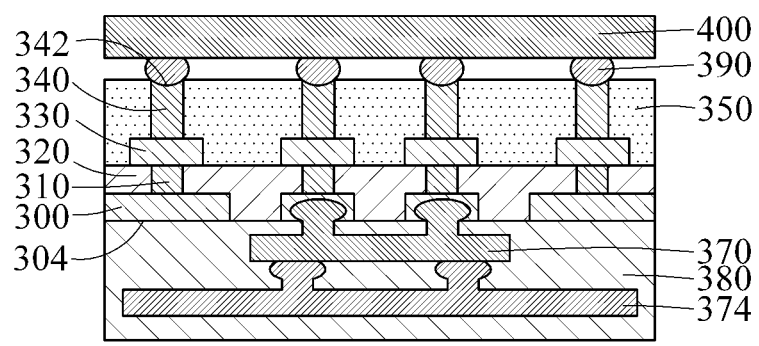
FIG. 12B is schematic diagram showing further another posterior package apparatus of the first embodiment of the present invention.

Please refer to FIG. 12B, which is schematic diagram showing further another posterior package apparatus of the first embodiment of the present invention. For manufacturing the package apparatus of FIG. 12B, the manufacturing method of FIG. 11 further comprises a step that is to be performed after the step S1122 and before the step S1124, which is enabled as following: providing an external unit 374 to be disposed on and electrically connected to the first external unit 370, but is not limited thereby.

It is noted that the present invention also provides a package apparatus and manufacturing method thereof, in which a solder resist layer that is generally seen in those conventional molding compound substrate structures or EPP substrate structures is replaced by a molding compound layer and thus the process used for forming the solder resist layer can be avoided, so that the conventional problems resulting from the poor resolution of solder mask opens in the BGA and the poor film thickness uniformity of the solder resist layer are avoided and thus the reliability of any posterior process is improved.

Figure 13A:
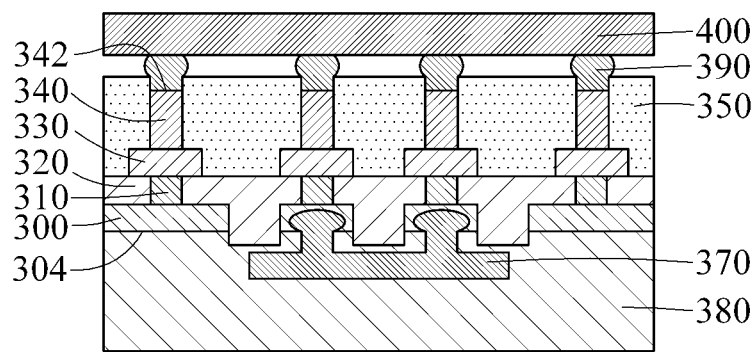
FIG. 13A is schematic diagram showing a posterior package apparatus of the tenth embodiment of the present invention.

Please refer to FIG. 13A, which is schematic diagram showing a posterior package apparatus of the tenth embodiment of the present invention. In this embodiment, the second surface 304 of the first conductive pillar layer 300 is positioned lower than the dielectric material layer 320, and the first surface 342 of the second conductive pillar layer 340 is disposed lower than the first molding compound layer 350, by that the conductive solder balls of the first external unit 370 and the plural first conducting units 390 can be disposed inside grooves formed between the dielectric material layer 320 and the first molding compound layer 350 while being electrically connected. In addition, by the design of the grooves, the conductive solder balls of the first external unit 370 as well as the plural first conducting units 390 can be prevented from moving horizontally so that shortage between different conductive pillar layers can be prevented. Moreover, since either the second surface of the first conductive wiring layer or the first surface of the second conductive pillar layer can be etched into an arc-shaped concave surface, not only the conductive solder balls of the first external unit 370 as well as the plural first conducting units 390 can be fixed effectively, but also the resolution of solder mask opens in the BGA is enhanced.

Figure 13B:
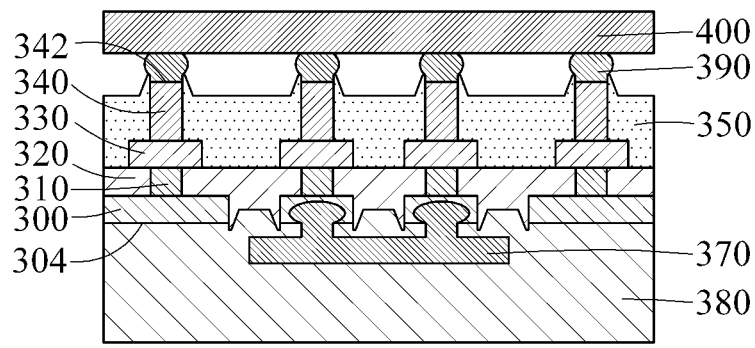
FIG. 13B is schematic diagram showing a posterior package apparatus of the twenty-eighth embodiment of the present invention.

Please refer to FIG. 13B, which is schematic diagram showing a posterior package apparatus of the twenty-eighth embodiment of the present invention. In the embodiment shown in FIG. 13B, the second surface 304 of the first conductive pillar layer 300 is positioned lower than the dielectric material layer 320 while allowing the dielectric material layer 320 to cover all the surfaces of the first conductive wiring layer 300, and the first surface 342 of the second conductive pillar layer 340 is disposed lower than the first molding compound layer 350 while allowing the first molding compound layer 350 to cover all the surfaces of the second conductive pillar layer 340, by that the conductive solder balls of the first external unit 370 and the plural first conducting units 390 can be disposed inside grooves formed between the dielectric material layer 320 and the first molding compound layer 350 while being electrically connected. In addition, by the design of the grooves, the conductive solder balls of the first external unit 370 as well as the plural first conducting units 390 can be prevented from moving vertically downward so that shortage between different conductive pillar layers can be prevented. Moreover, since either the second surface of the first conductive wiring layer or the first surface of the second conductive pillar layer can be etched into an arc-shaped concave surface, not only the conductive solder balls of the first external unit 370 as well as the plural first conducting units 390 can be fixed effectively, but also the resolution of solder mask opens in the BGA is enhanced.

Figure 14:
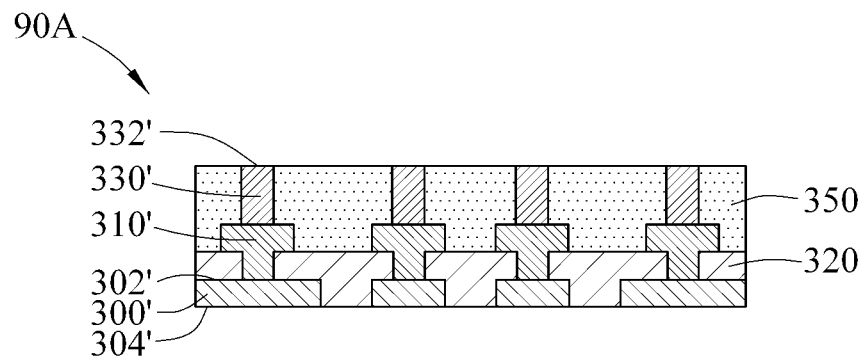
FIG. 14 is schematic diagram showing a package apparatus according to a forty-ninth embodiment of the present invention.

Please refer to FIG. 14, which is schematic diagram showing a package apparatus according to a forty-ninth embodiment of the present invention. In FIG. 14, a package apparatus 90A is disclosed, which comprises: a first conductive wiring layer 300', a dielectric material layer 320', a second conductive wiring layer 310', a first conductive pillar layer 330', and a first molding compound layer 350. The first conductive wiring layer 300' is formed with a first surface 302' and a second surface 304' that are arranged opposite to each other, and in an embodiment, the first conductive wiring layer 300' can be a wiring layer with patterns which includes at least one wire or at least one chip seat, and also the first conductive wiring layer 300' is disposed inside the dielectric material layer 320. In addition, It is noted that the dielectric material layer 320 can be made of a thermosetting substance or a photo-sensitive substance, whichever is composed of a resin material, a silicon nitride material or a silicon oxide material, but is not limited thereby. The second conductive wiring layer 310' is disposed on the first conductive wiring layer 300' and the dielectric material layer 320, and the first conductive pillar layer 330' is disposed on the second conductive wiring layer 310' Similarly, the first conductive pillar layer 330' can be a wiring layer with patterns which includes at least one wire or at least one chip seat, whereas in this embodiment, the first conductive pillar layer 330' is a ball grid array (BGA) electrode layer. In addition, the second conductive wiring layer 310' and the first conductive wiring layer 330' are disposed inside the first molding compound layer 350, whereas the first molding compound layer 350 is made of a molding compound material for chip packaging and is composed of a material selected from the group consisting of novolac-based resin, epoxy-based resin, silicon-based resign and other molding compounds, but is not limited thereby.

In the present invention, the second surface 304' of the first conductive wiring layer 300' can be disposed higher than, or lower than the first molding compound layer 350 In this embodiment, the second surface 304' of the first conductive wiring layer 30'0 is disposed coplanar with the dielectric material layer 320, and the first surface 342' of the first conductive wiring layer 330' is disposed coplanar with the first molding compound layer 350, however, they are not limited thereby. It is noted that the variations of the present embodiment are formed similar to those other apparatuses 30B-30H, and thus further description will not be provided herein.

It is noted that, in the present invention, a dielectric material layer that is formed by additive layout process is used for replacing a first molding compound layer in a conventional molding compound substrate structure, and thereby the production cost and the production complexity are decreased as the conventional insufficient binding force issue between the first molding compound layer and the other conductive layers that is generally seen in the fabrication of fine-line products and requires to be solved by an additional dielectric material layer is eliminated.

It is noted that the line width of the second conductive wiring layer 310' can be formed larger than or smaller than the pillar width of the first conductive pillar layer 330'. In this embodiment, the line width of the second conductive wiring layer 310' is formed larger than the pillar width of the first conductive pillar layer 330', but is not limited thereby.

It is noted that the present invention also provides a package apparatus and manufacturing method thereof, in which a solder resist layer that is generally seen in those conventional molding compound substrate structures or EPP substrate structures is replaced by a molding compound layer and thus the process used for forming the solder resist layer can be avoided, so that the conventional problems resulting from the poor resolution of solder mask opens in the BGA and the poor film thickness uniformity of the solder resist layer are avoided and thus the reliability of any posterior process is improved.

Figure 15:
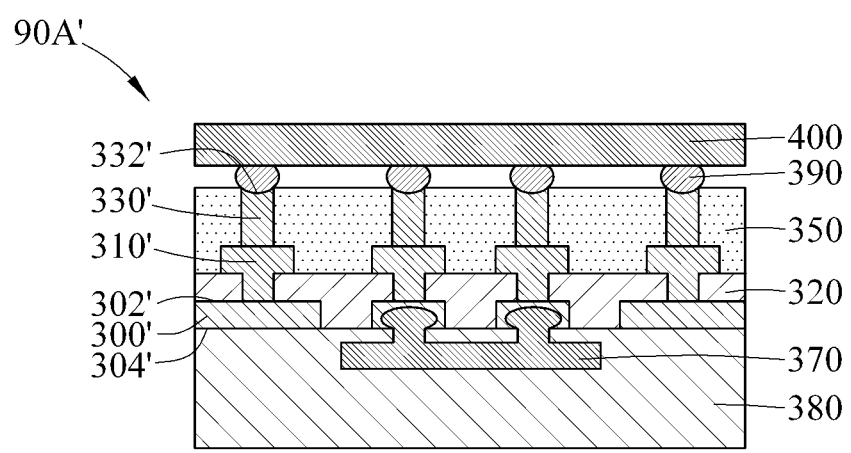
FIG. 15 is schematic diagram showing a posterior package apparatus of the forty-ninth embodiment of the present invention.

Please refer to FIG. 15, which is schematic diagram showing a posterior package apparatus of a forty-ninth embodiment of the present invention. In FIG. 15, a posterior package apparatus 90A' that is basically the package apparatus 90A of FIG. 14 added with a first external unit 370, a second molding compound layer 380, a plurality of first conducting units 390 and a second external unit 400. The first external unit 370 is disposed on and electrically connected to the second surface 304' of the first conductive wiring layer 300'. The second molding compound layer 380 is disposed on the first external unit 370 and the second surface 304' of the first conductive wiring layer 300', while allowing the first external unit 370 to be disposed inside the second molding compound layer 380. The plural first conducting units 390 are disposed on the first conductive pillar layer 330'. In an embodiment, each of the first external unit and the second external unit is a unit selected from the group consisting of: an active component, a passive element, a semiconductor chip, a flexible circuitboard and a printed circuitboard, but is not limited thereby. It is noted that the variations of the present embodiment are formed similar to the package apparatus 90A, and thus further description will not be provided herein.

Figure 16:
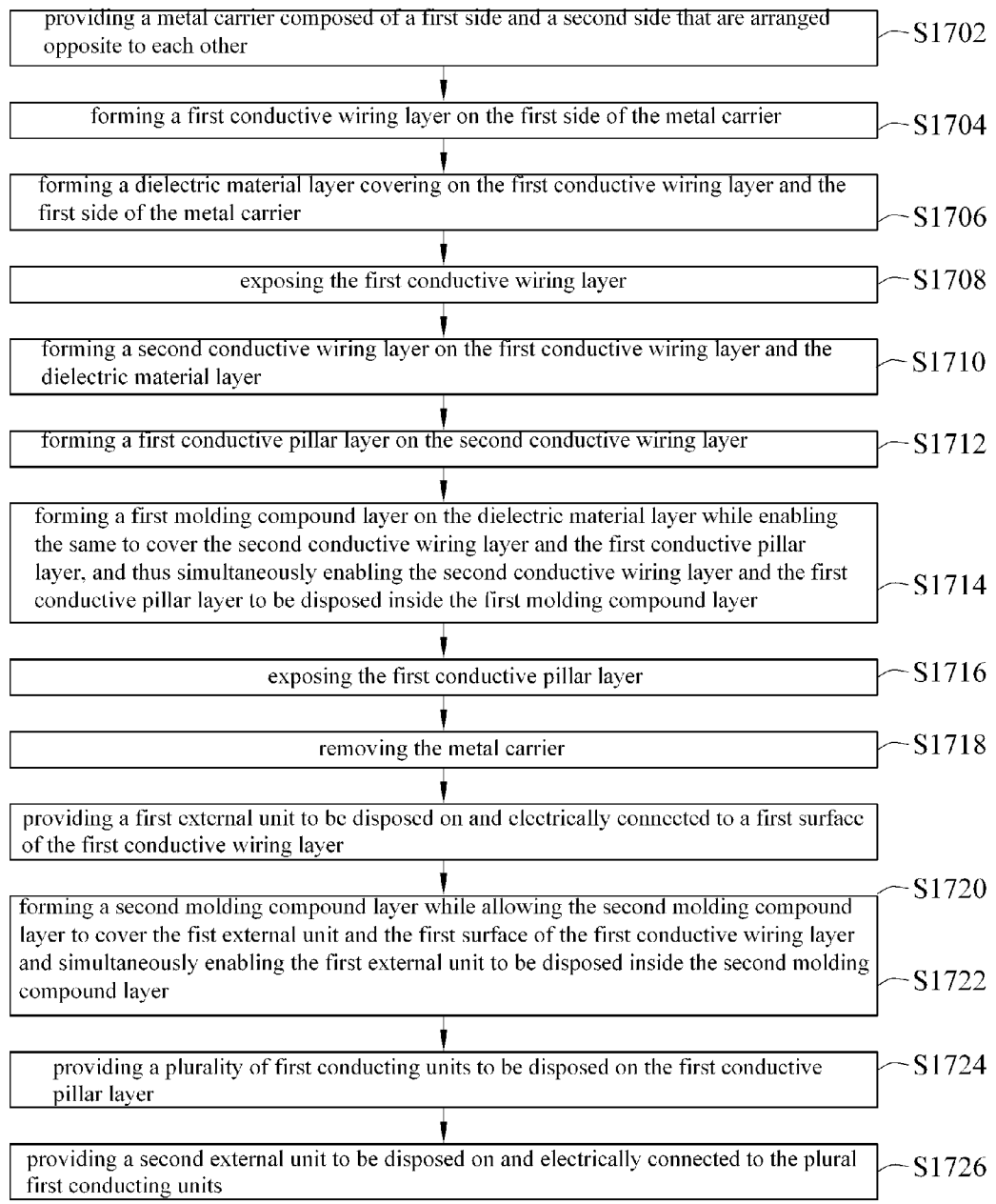
FIG. 16 is a flow chart depicting steps performing in a method for manufacturing a package apparatus of the forty-ninth embodiment of the present invention.
Figure 17A:
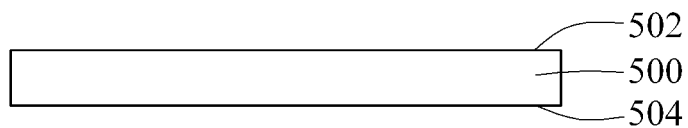
FIG. 17A to FIG. 17M are schematic diagrams illustrating the manufacturing of the package apparatus of the forty-ninth embodiment.
Figure 17B:
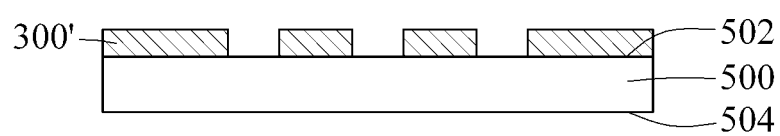
Figure 17C:
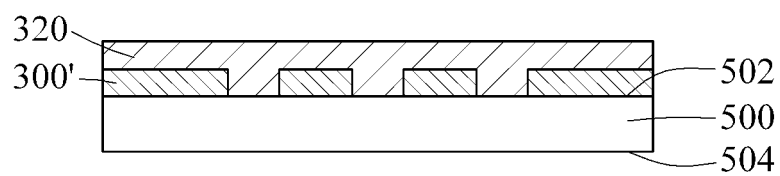
Figure 17D:
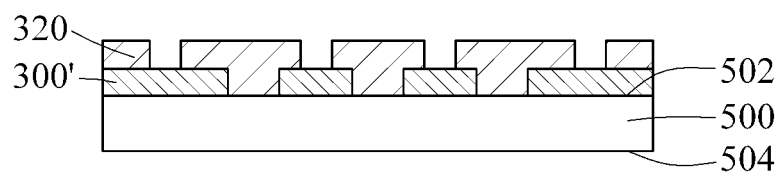
Figure 17E:
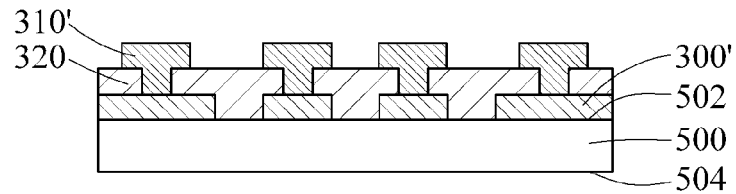
Figure 17F:
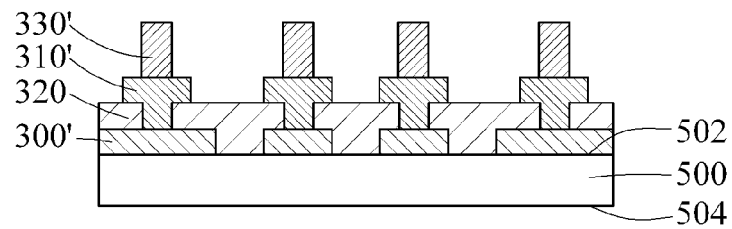
Figure 17G:
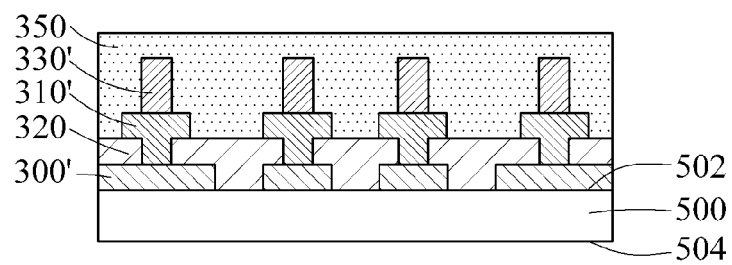
Figure 17H:
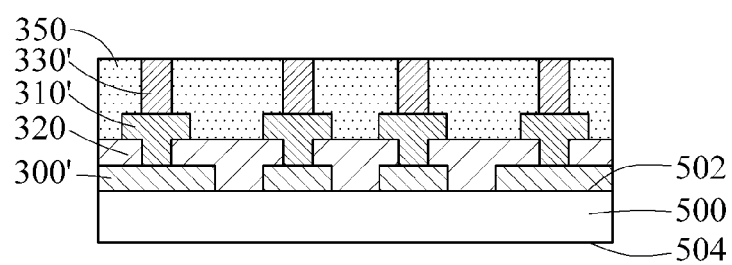
Figure 17I:
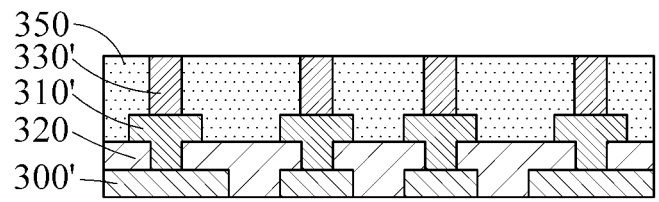
Figure 17J:
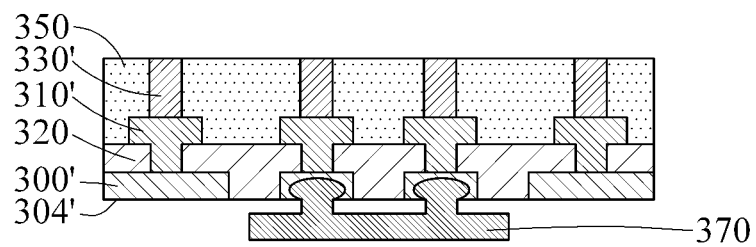
Figure 17K:
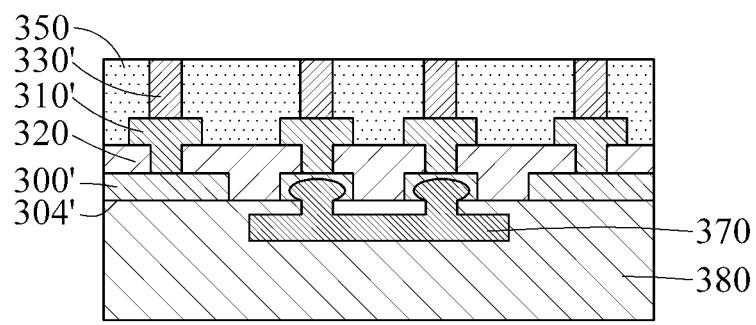
Figure 17L:
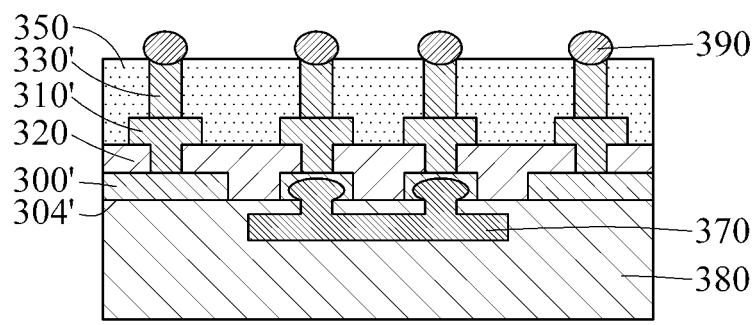
Figure 17M:
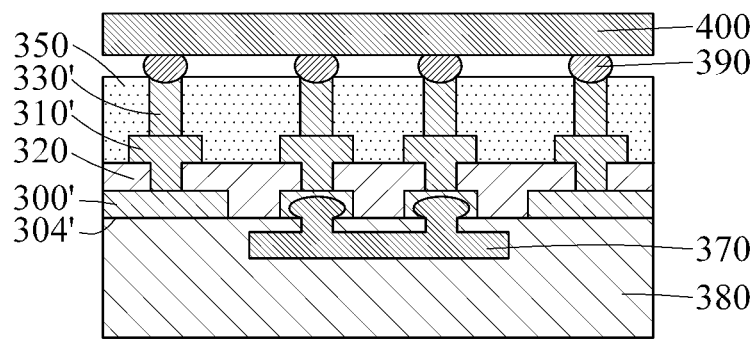

FIG. 16 is a flow chart depicting steps performing in a method for manufacturing a package apparatus of the forty-ninth embodiment. FIG. 17A to FIG. 17M are schematic diagrams illustrating the manufacturing of a package apparatus of the forty-ninth embodiment. As shown in FIG. 16, a method for manufacturing the package apparatus comprises the following steps:

- step S1702: providing a metal carrier 500 composed of a first side 502 and a second side 504 that are arranged opposite to each other, as shown in FIG. 17A;
- step S1704: forming a first conductive wiring layer 300' on the first side 502 of the metal carrier 500, as shown in FIG. 171B, whereas the first conductive wiring layer 300' is formed using an electrolytic plating process in this embodiment, but is not limited thereby, and moreover, the first conductive wiring layer 300' can be a wiring layer with patterns which includes at least one wire or at least one chip seat, and the first wiring layer 300 can be made of a metal, such as copper;
- step S1706: forming a dielectric material layer 320 while allowing the same to cover the first side 502 of the metal carrier 500 and the first conductive wiring layer 300', as shown in FIG. 17C, wherein the dielectric material layer 320 can be made of a material selected from the group consisting of: a thermosetting substance, and a photosensitive substance, which can be a material selected from the group consisting of: a resin material, a silicon nitride material and a silicon oxide material, but is not limited thereby; and noting that, by the use of the dielectric material layer that is formed by additive layout process in the manufacturing method of the present invention for replacing the molding compound layer in a conventional molding compound substrate structure, the production cost and the production complexity are decreased as the conventional insufficient binding force issue between the first molding compound layer and the other conductive layers that is generally seen in the fabrication of fine-line products and requires to be solved by an additional dielectric material layer is eliminated;
- step S1708: enabling the first conductive wiring layer 300' to be exposed, as shown in FIG. 17D, whereas in this embodiment, the exposing of the first conductive wiring layer 300' is enabled by the use of a photolithography and etching process for removing a portion of the dielectric material layer 320 so as to expose the first conductive wiring layer 300', but it is not limited thereby;
- step S1701: forming a second conductive wiring layer 310' on the first conductive wiring layer 300' and the dielectric material layer 320 for enabling the first conductive wiring layer 300' to be structured as the combination of the second conductive wiring layer 310' and an aforesaid first conductive pillar layer 330, as shown in FIG. 17E, whereas the second conductive wiring layer 310' can be formed by the use of an electrolytic plating process, an electroless plating process, a sputtering coating process, or a thermal coating process, but is not limited thereby, and moreover, the second conductive wiring layer 310' can be a wiring layer with patterns which includes at least one wire or at least one chip seat, and is a layer formed at a position corresponding to one end of the first conductive wiring layer 300', moreover, the second conductive wiring layer 310' can be made of a metal, such as copper;
- step S1712: forming a first conductive pillar layer 330' on the second conductive wiring layer 310' for enabling the first conductive pillar layer 330' to be structured similar to the combination of the second conductive wiring layer 340 of FIG. 3A, as shown in FIG. 17F, whereas the first conductive wiring layer 330' can be formed by the use of an electrolytic plating process, an electroless plating process, a sputtering coating process, or a thermal coating process, but is not limited thereby, and moreover, the first conductive wiring layer 330' can be a wiring layer with patterns which includes at least one wire or at least one chip seat, and is a layer formed at a position corresponding to the second conductive wiring layer 310', moreover, the first conductive wiring layer 330' can be made of a metal, such as copper;
- step S1714: forming a first molding compound layer 320 for allowing the same to cover the second conductive wiring layer 310' and the first conductive pillar layer 330' and to be disposed on the dielectric material layer 320, while enabling the second conductive wiring layer 310' and the first conductive pillar layer 330' to be disposed inside the first molding compound layer 320, as shown in FIG. 17G, whereas, in this embodiment, the first molding compound layer 320 is formed by a process selected from the group consisting of: a transfer molding process, a top molding process, a compression molding process, an injection molding process and a vacuum casting molding process, and can be made from a material selected from the group consisting of novolac-based resin, epoxy-based resin, silicon-based resign and other molding compounds, whichever can be heated to a liquid state so as to be poured on the dielectric material layer 320 for allowing the same to cover the second conductive wiring layer 310', the first conductive pillar layer 330' and the dielectric material layer 320 under a high-temperature and high-pressure condition, and thereafter, to be cured into the first molding compound layer 320, and moreover the first molding compound layer 320 can be composed of a kind of filler, such as a powdered silicon dioxide; and in another embodiment, the formation of the first molding compound layer 320 can include the steps of: providing a molding compound to be heated to a liquid state, whereas the molding compound is composed of a resin and powdered silicon dioxide; pouring the liquefied molding compound on the first side 502 of the metal carrier 500 while allowing the molding compound to cover the second conductive wiring layer 310', the first conductive pillar layer 330' and the dielectric material layer 320 under a high-temperature and high-pressure condition; and curing the molding compound for enabling the same to form the first molding compound layer 320, but is not limited thereby;
- step S1716: enabling the first conductive pillar 330' to be exposed, as shown in FIG. 17H, whereas in this embodiment, the exposing of the first conductive pillar layer 330' is enabled by grinding and removing a portion of the first molding compound layer 320 so as to expose the first surface 332' of the first conductive pillar layer 330', however, under ideal condition, the first surface 332' of the first conductive pillar layer 330' is positioned coplanar with the first molding compound layer 320, by that the exposing of the first conductive pillar layer 330' can be achieved simultaneously with the formation of the first molding compound layer 320, and thus the process for grinding and removing of the first molding compound layer 320 can be avoided;

step S1718: removing the metal carrier 500 for exposing the wires and the chip seats of the first conductive wiring layer 300', as shown in FIG. 17I, whereas the removal of the metal carrier 500 can be performed using an etching process, or a debonding process, or even a physical process of grinding, but is not limited thereby;

step S1720: providing a first external unit 370 to be disposed on and electrically connected to a first surface 302' of the first conductive wiring layer 300', as shown in FIG. 17J, whereas, in an embodiment, the first external unit 370 can be an active component, a passive component, a semiconductor chip, a flexible circuitboard or a printed circuitboard, but is not limited thereby;

step S1722: forming a second molding compound layer 380 for allowing the same to cover the first external unit 370 and the first surface 302' of the first conductive wiring layer 300' while enabling the first external unit 370 to be disposed inside the second molding compound layer 380, as shown in FIG. 17K, whereas, in this embodiment, the second molding compound layer 380 is formed by a process selected from the group consisting of: a transfer molding process, a top molding process, a compression molding process, an injection molding process and a vacuum casting molding process, and can be made from a material selected from the group consisting of novolac-based resin, epoxy-based resin, silicon-based resign and other molding compounds, whichever can be heated to a liquid state so as to be poured on the first surface 302' of the first conductive wiring layer 300' while covering the first external unit 370 under a high-temperature and high-pressure condition, and thereafter, to be cured into the second molding compound layer 380, and moreover the second molding compound layer 380 can be composed of a kind of filler, such as a powder silicon dioxide;

step S1724: providing a plurality of first conducting units 390 to be disposed on the first conductive pillar layer 330', as shown in FIG. 17L; whereas each of the plural first conducting units 390 can be made of a metal, such as copper; and in this embodiment, the first surface 332' of the first conductive pillar layer 330' can be etched into an arc-shaped concave surface so as to effectively fixing the first conducting units 390, but it is not limited thereby;

step S1726: providing a second external unit 400 to be disposed on and electrically connected to plural first conducting units 390, as shown in FIG. 17M, whereas, in an embodiment, the second external unit 400 can be an active component, a passive component, a semiconductor chip, a flexible circuitboard or a printed circuitboard, but is not limited thereby.

It is noted that the present invention also provides a package apparatus and manufacturing method thereof, in which a solder resist layer that is generally seen in those conventional molding compound substrate structures or EPP substrate structures is replaced by a molding compound layer and thus the process used for forming the solder resist layer can be avoided, so that the conventional problems resulting from the poor resolution of solder mask opens in the BGA and the poor film thickness uniformity of the solder resist layer are avoided and thus the reliability of any posterior process is improved.

To sum up, by the use of the package apparatus and manufacturing method thereof that are described in the present invention, it is noted that a dielectric material layer that is formed by additive layout process is used for replacing a first molding compound layer in a conventional molding compound substrate structure, while a solder resist layer that is generally seen in those conventional molding compound substrate structures or EPP substrate structures is replaced by a molding compound layer, and thereby it is clear that the present invention has the following advantages: (1) the production cost and the production complexity are decreased as the conventional insufficient binding force issue between the first molding compound layer and the other conductive layers that is generally seen in the fabrication of fine-line products and requires to be solved by an additional dielectric material layer is eliminated; (2) the process used for forming the solder resist layer can be avoided, so that the conventional problems resulting from the poor resolution of solder mask opens in the BGA and the poor film thickness uniformity of the solder resist layer are avoided and thus the reliability of any posterior process is improved.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A package apparatus, comprising:
   a first conductive wiring layer, having a first surface and a second surface that are arranged opposite to each other;
   a first conductive pillar layer, disposed on the first surface of the first conductive wiring layer;
   a dielectric material layer, formed for allowing the first conductive wiring layer and the first conductive pillar layer to be disposed inside the same;
   a second conductive wiring layer, disposed on the first conductive pillar layer and the dielectric material layer;
   a second conductive pillar layer, disposed on the second conductive wiring layer;
   a first molding compound layer, wherein the second conductive wiring layer and the second conductive pillar layer are disposed inside the first molding compound;
   a third external unit, disposed on and electrically connected to the second surface of the first conductive wiring layer;
   a fourth external unit, disposed on and electrically connected to the second surface of the first conductive wiring layer;
   a third molding compound layer, disposed on the third external unit, the fourth external unit and the second surface of the first conductive wiring layer, while allowing the third external unit and the fourth external unit to be disposed inside the third molding compound layer;
   a plurality of second conducting units, disposed on the second conductive pillar layer; and
   a fifth external unit, disposed on and electrically connected to the plural second conducting units.

2. The package apparatus of claim 1, wherein the second surface of the first conductive wiring layer is positioned not higher than bottom surface of the dielectric material layer, and the second conductive pillar layer is positioned not higher than the first molding compound layer.

3. The package apparatus of claim 2, wherein the dielectric material layer is formed covering all surfaces of the first conductive wiring layer other than the second surface, and the first molding compound layer is formed covering all the surfaces of the second conductive pillar layer.

4. The package apparatus of claim 1, wherein the first surface of the first conductive wiring layer is positioned not higher than the dielectric material layer, and the second conductive pillar layer is positioned higher than the first molding compound layer.

5. The package apparatus of claim 4, wherein the dielectric material layer is formed covering all the surfaces of the first conductive wiring layer, and the first molding compound layer is formed covering a specific portion of the surfaces of the second conductive pillar layer.

6. The package apparatus of claim 4, wherein the first external unit is a unit selected from the group consisting of: an active component, a passive element, a semiconductor chip, a flexible circuitboard and a printed circuitboard.

7. The package apparatus of claim 1, wherein the first surface of the first conductive wiring layer is positioned higher than the dielectric material layer, and the second conductive pillar layer is positioned not higher than the first molding compound layer.

8. The package apparatus of claim 7, wherein the dielectric material layer is formed covering a specific portion of the surfaces of the first conductive wiring layer, and the first molding compound layer is formed covering all the surfaces of the second conductive pillar layer.

9. The package apparatus of claim 1, wherein the first surface of the first conductive wiring layer is positioned higher than the dielectric material layer, and the second conductive pillar layer is positioned higher than the first molding compound layer.

10. The package apparatus of claim 9, wherein the dielectric material layer is formed covering a specific portion of the surfaces of the first conductive wiring layer, and the first molding compound layer is formed covering a specific portion of the surfaces of the second conductive pillar layer.

11. The package apparatus of claim 1, further comprising:
a solder resist layer, disposed on the second surface of the first conductive wiring layer, while allowing a specific portion of the first conductive wiring layer and also a specific portion of the dielectric material layer to be exposed.

12. The package apparatus of claim 1, wherein the first conductive pillar layer is further composed of a first conducting layer, a second conducting layer and a third conducting layer in a manner that the first conducting layer being substantially a conductive pillar layer is disposed on the first conductive wiring layer, the second conducting layer being substantially a conductive wiring layer is disposed on the first conducting layer, and the third conducting layer being a conductive pillar layer is disposed at a position between the first conducting layer and the second conducting layer.

13. The package apparatus of claim 1, wherein the line width of the second conductive wiring layer is formed not larger than the pillar width of the second conductive pillar layer.

14. The package apparatus of claim 1, wherein a line width of the second conductive wiring layer is formed larger than a pillar width of the second conductive pillar layer.

15. The package apparatus of claim 1, further comprising:
a first external unit, disposed on and electrically connected to the second surface of the first conductive wiring layer;
a second molding compound layer, disposed on the first external unit and the second surface of the first conductive wiring layer, while allowing the first external unit to be disposed inside the second molding compound layer;
a plurality of first conducting units, disposed on the second conductive pillar layer; and
a second external unit, disposed on and electrically connected to the plural first conducting units.

16. The package apparatus of claim 1, further comprising:
a sixth external unit, disposed on and electrically connected to the second surface of the first conductive wiring layer;
a seventh external unit, disposed on and electrically connected to the sixth external unit;
a fourth molding compound layer, disposed on the sixth external unit, the seventh external unit and the second surface of the first conductive wiring layer, while allowing the sixth external unit and the seventh external unit to be disposed inside the fourth molding compound layer;
a plurality of third conducting units, disposed on the second conductive pillar layer; and
an eighth external unit, disposed on and electrically connected to the plural third conducting units.

17. The package apparatus of claim 1, wherein the dielectric material layer is made of a material selected from the group consisting of: a thermosetting substance, and a photosensitive substance.

18. The package apparatus of claim 1, wherein the dielectric material layer is made of a material selected from the group consisting of: a resin material, a silicon nitride material and a silicon oxide material.

19. The package apparatus of claim 1, wherein each of the first conductive wiring layer and the second conductive pillar layer includes at least one wire or at least one chip seat.

20. The package apparatus of claim 1, wherein the first molding compound layer is made of a molding compound material for chip packaging and is composed of a material selected from the group consisting of novolac-based resin, epoxy-based resin, silicon-based resign and other molding compounds.

21. A package apparatus, comprising:
a first conductive wiring layer, having a first surface and a second surface that are arranged opposite to each other;
a dielectric material layer, formed for allowing the first conductive wiring layer to be disposed inside the same;
a second conductive wiring layer, disposed on the first conductive wiring layer and the dielectric material layer;
a first conductive pillar layer, disposed on the second conductive wiring layer;
a first molding compound layer, wherein the second conductive wiring layer and the first conductive pillar layer are disposed inside the first molding compound layer;
a third external unit, disposed on and electrically connected to the second surface of the first conductive wiring layer;
a fourth external unit, disposed on and electrically connected to the second surface of the first conductive wiring layer;
a third molding compound layer, disposed on the third external unit, the fourth external unit and the second surface of the first conductive wiring layer, while allowing the third external unit and the fourth external unit to be disposed inside the third molding compound layer;
a plurality of second conducting units, disposed on the first conductive pillar layer; and
a fifth external unit, disposed on and electrically connected to the plural second conducting units.

22. The package apparatus of claim 21, wherein the second surface of the first conductive wiring layer is positioned not higher than bottom surface of the dielectric material layer, and the first conductive pillar layer is positioned not higher than top surface of the first molding compound layer.

23. The package apparatus of claim 22, wherein the dielectric material layer is formed covering all the surfaces of the first conductive wiring layer, and the first molding compound layer is formed covering all the surfaces of the first conductive pillar layer.

24. The package apparatus of claim 21, wherein the first surface of the first conductive wiring layer is positioned not higher than the dielectric material layer, and the first conductive pillar layer is positioned higher than the first molding compound layer.

25. The package apparatus of claim 24, wherein the dielectric material layer is formed covering all the surfaces of the first conductive wiring layer, and the first molding compound layer is formed covering a specific portion of the surfaces of the first conductive pillar layer.

26. The package apparatus of claim 21, wherein the first surface of the first conductive wiring layer is positioned higher than the dielectric material layer, and the first conductive pillar layer is positioned not higher than the first molding compound layer.

27. The package apparatus of claim 26, wherein the dielectric material layer is formed covering a specific portion of the surfaces of the first conductive wiring layer, and the first molding compound layer is formed covering all the surfaces of the first conductive pillar layer.

28. The package apparatus of claim 21, wherein the first surface of the first conductive wiring layer is positioned higher than the dielectric material layer, and the first conductive pillar layer is positioned higher than the first molding compound layer.

29. The package apparatus of claim 28, wherein the dielectric material layer is formed covering a specific portion of the surfaces of the first conductive wiring layer, and the first molding compound layer is formed covering a specific portion of the surfaces of the first conductive pillar layer.

30. The package apparatus of claim 21, further comprising:
a solder resist layer, disposed on the second surface of the first conductive wiring layer and the dielectric material layer, while allowing a specific portion of the first conductive wiring layer and also a specific portion of the dielectric material layer to be exposed.

31. The package apparatus of claim 21, wherein the second conductive wiring layer is further composed of a first conducting layer, a second conducting layer and a third conducting layer in a manner that the first conducting layer being substantially a conductive pillar layer is disposed on the first conductive wiring layer, the second conducting layer being substantially a conductive wiring layer is disposed on the first conducting layer, and the third conducting layer being a conductive pillar layer is disposed at a position between the first conducting layer and the second conducting layer.

32. The package apparatus of claim 21, wherein the line width of the second conductive wiring layer is formed not larger than the pillar width of the first conductive pillar layer.

33. The package apparatus of claim 21, wherein the line width of the second conductive wiring layer is formed larger than the pillar width of the first conductive pillar layer.

34. The package apparatus of claim 21, further comprising:
a first external unit, disposed on and electrically connected to the second surface of the first conductive wiring layer;
a second molding compound layer, disposed on the first external unit and the second surface of the first conductive wiring layer, while allowing the first external unit to be disposed inside the second molding compound layer;
a plurality of first conducting units, disposed on the first conductive pillar layer; and
a second external unit, disposed on and electrically connected to the plural first conducting units.

35. The package apparatus of claim 34, wherein each of the first external unit and the second external unit is a unit selected from the group consisting of: an active component, a passive element, a semiconductor chip, a flexible circuitboard and a printed circuitboard.

36. The package apparatus of claim 21, further comprising:
a sixth external unit, disposed on and electrically connected to the second surface of the first conductive wiring layer;
a seventh external unit, disposed on and electrically connected to the sixth external unit;
a fourth molding compound layer, disposed on the sixth external unit, the seventh external unit and the second surface of the first conductive wiring layer, while allowing the sixth external unit and the seventh external unit to be disposed inside the fourth molding compound layer;
a plurality of third conducting units, disposed on the first conductive pillar layer; and
an eighth external unit, disposed on and electrically connected to the plural third conducting units.

37. The package apparatus of claim 21, wherein the dielectric material layer is made of a material selected from the group consisting of: a thermosetting substance, and a photosensitive substance.

38. The package apparatus of claim 21, wherein the dielectric material layer is made of a material selected from the group consisting of: a resin material, a silicon nitride material and a silicon oxide material.

39. The package apparatus of claim 21, wherein each of the first conductive wiring layer and the first conductive pillar layer includes at least one wire or at least one chip seat.

40. The package apparatus of claim 21, wherein the first molding compound layer is made of a molding compound material for chip packaging and is composed of a material selected from the group consisting of novolac-based resin, epoxy-based resin, silicon-based resign and other molding compounds.

* * * * *